(12) United States Patent
Chiang et al.

(10) Patent No.: US 11,038,061 B2
(45) Date of Patent: Jun. 15, 2021

(54) SEMICONDUCTOR DEVICE STRUCTURE AND METHOD FOR FORMING THE SAME

(71) Applicant: Taiwan Semiconductor Manufacturing Co., Ltd., Hsinchu (TW)

(72) Inventors: Kuo-Cheng Chiang, Zhubei (TW); Shi-Ning Ju, Hsinchu (TW); Ching-Wei Tsai, Hsinchu (TW); Kuan-Lun Cheng, Hsin-Chu (TW); Chih-Hao Wang, Baoshan Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/683,559

(22) Filed: Nov. 14, 2019

(65) Prior Publication Data

US 2020/0343377 A1    Oct. 29, 2020

Related U.S. Application Data

(63) Continuation of application No. 16/395,731, filed on Apr. 26, 2019.

(51) Int. Cl.
*H01L 29/78* (2006.01)
*H01L 21/8238* (2006.01)
(Continued)

(52) U.S. Cl.
CPC .... *H01L 29/785* (2013.01); *H01L 21/823814* (2013.01); *H01L 21/823821* (2013.01);
(Continued)

(58) Field of Classification Search
None
See application file for complete search history.

(56) References Cited

U.S. PATENT DOCUMENTS 9,209,247 B2    12/2015    Colinge et al.
9,236,267 B2    1/2016    De et al.
(Continued)

FOREIGN PATENT DOCUMENTS

KR    10-2015-0126777 A    11/2015
KR    10-2019-0024534 A    3/2019
(Continued)

OTHER PUBLICATIONS

U.S. Office Action dated Aug. 25, 2020, issued in corresponding U.S. Appl. No. 16/395,731.

*Primary Examiner* — Hsien Ming Lee
(74) *Attorney, Agent, or Firm* — Birch, Stewart, Kolasch & Birch LLP

(57) ABSTRACT

A semiconductor device structure is provided. The semiconductor device structure includes a fin structure over a substrate, a first dielectric layer adjacent to the fin structure, and a second dielectric layer covering a sidewall of the first dielectric layer. The first dielectric layer has a different etching selectivity than the second dielectric layer. A bottom portion of the second dielectric layer is lower than a bottom surface of the first dielectric layer. The semiconductor device structure also includes a source/drain feature over the fin structure and covering a sidewall of the second dielectric layer, nanostructures over the fin structure, and a gate stack wrapping around the nanostructures.

20 Claims, 31 Drawing Sheets

(51) Int. Cl.
  *H01L 29/423* (2006.01)
  *H01L 29/66* (2006.01)
  *H01L 27/092* (2006.01)

(52) U.S. Cl.
  CPC .. *H01L 21/823878* (2013.01); *H01L 27/0924* (2013.01); *H01L 29/42392* (2013.01); *H01L 29/66545* (2013.01); *H01L 29/66795* (2013.01)

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2015/0311336 | A1 | 10/2015 | Ching et al. |
| 2019/0043857 | A1 | 2/2019 | Wu et al. |
| 2019/0067120 | A1 | 2/2019 | Ching et al. |
| 2019/0067283 | A1 | 2/2019 | Wang et al. |
| 2019/0103317 | A1 | 4/2019 | Yu et al. |
| 2019/0115472 | A1 | 4/2019 | Chang et al. |
| 2020/0020782 | A1* | 1/2020 | Ching ................ H01L 21/3086 |
| 2020/0058761 | A1 | 2/2020 | Ho et al. |
| 2020/0091311 | A1 | 3/2020 | Hsu et al. |

FOREIGN PATENT DOCUMENTS

| | | |
|---|---|---|
| KR | 10-2019-0036282 A | 4/2019 |
| TW | 201601257 A | 1/2016 |
| TW | 201911389 A | 3/2019 |
| TW | 201913756 A | 4/2019 |
| TW | 201916178 A | 4/2019 |
| WO | WO 2018/101957 A1 | 6/2018 |

* cited by examiner

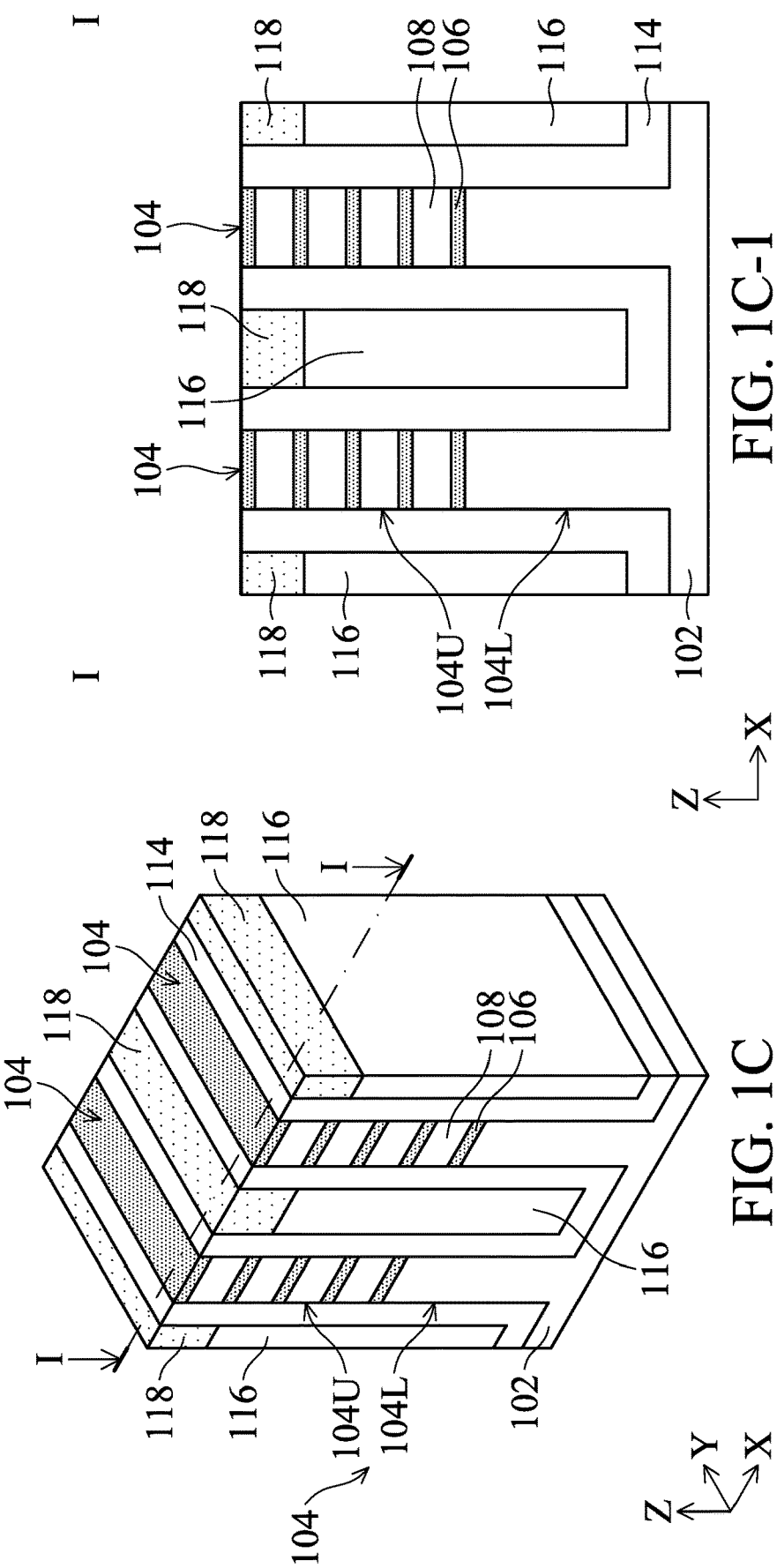

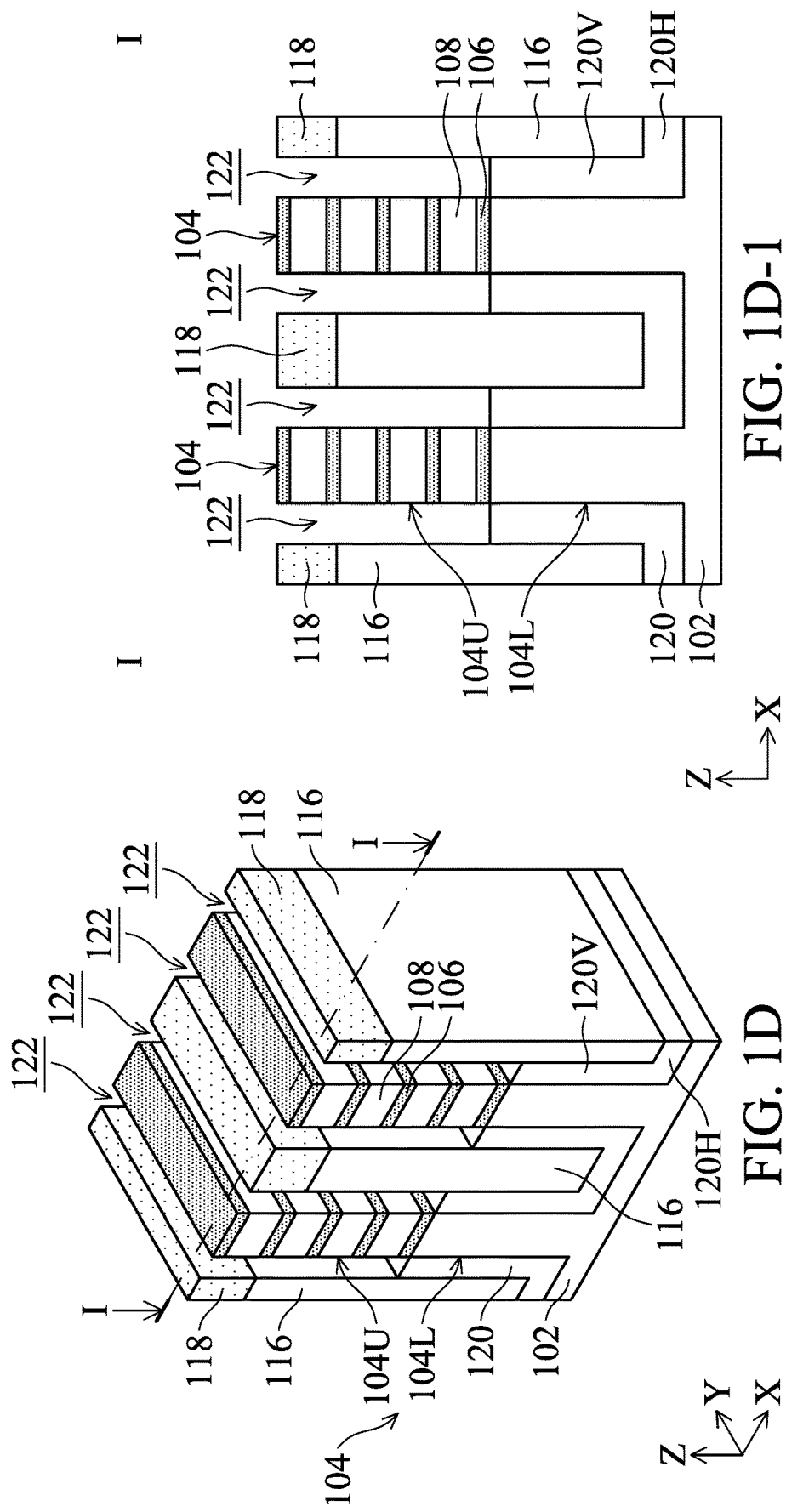

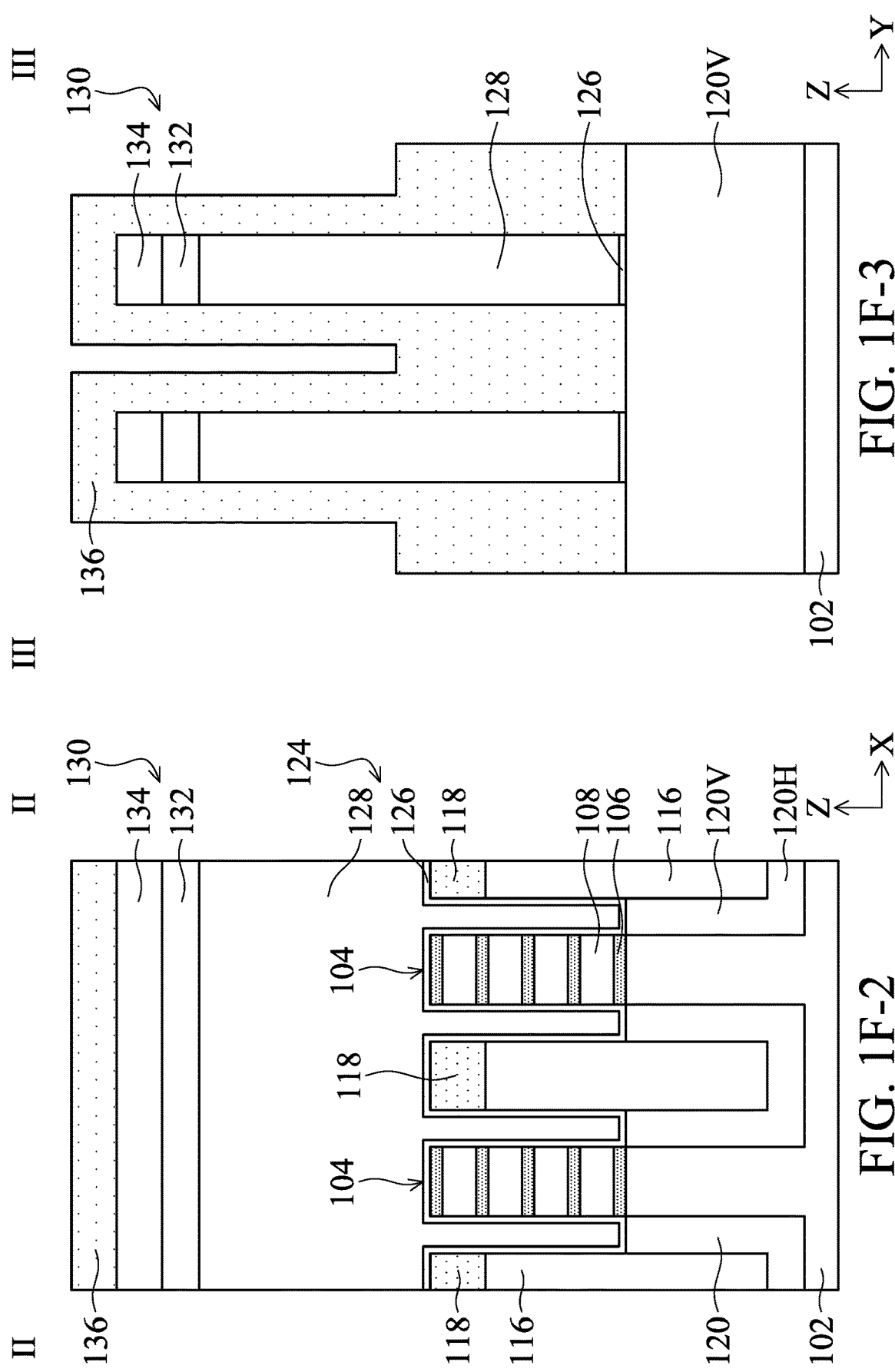

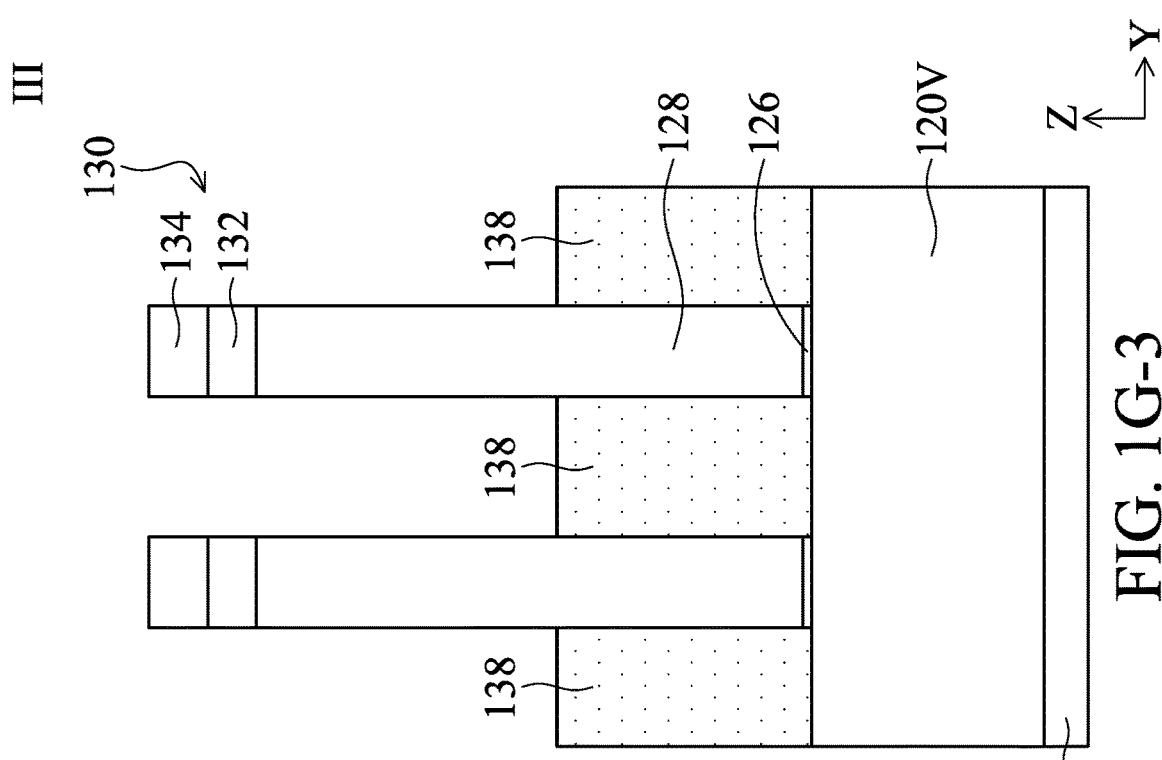
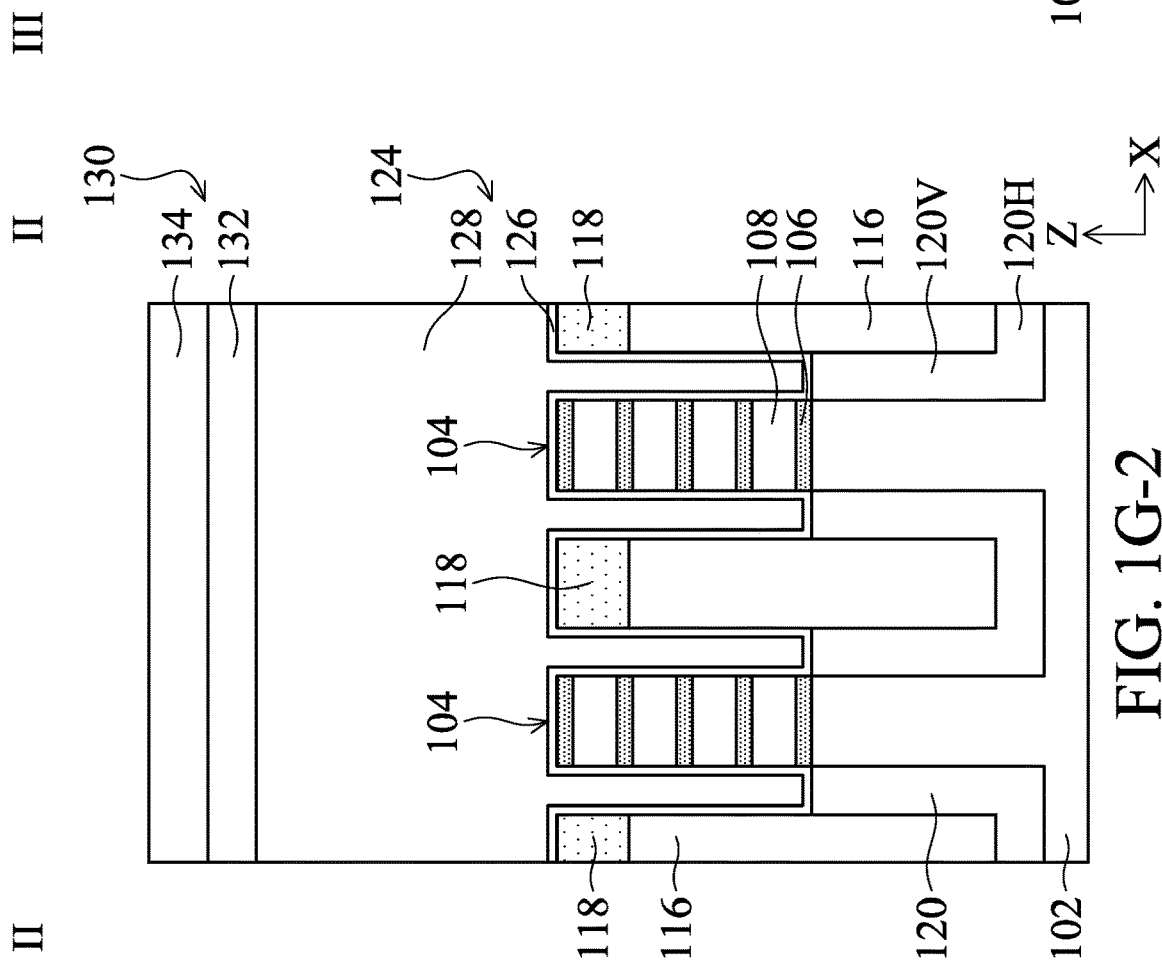
FIG. 1G-2
FIG. 1G-3

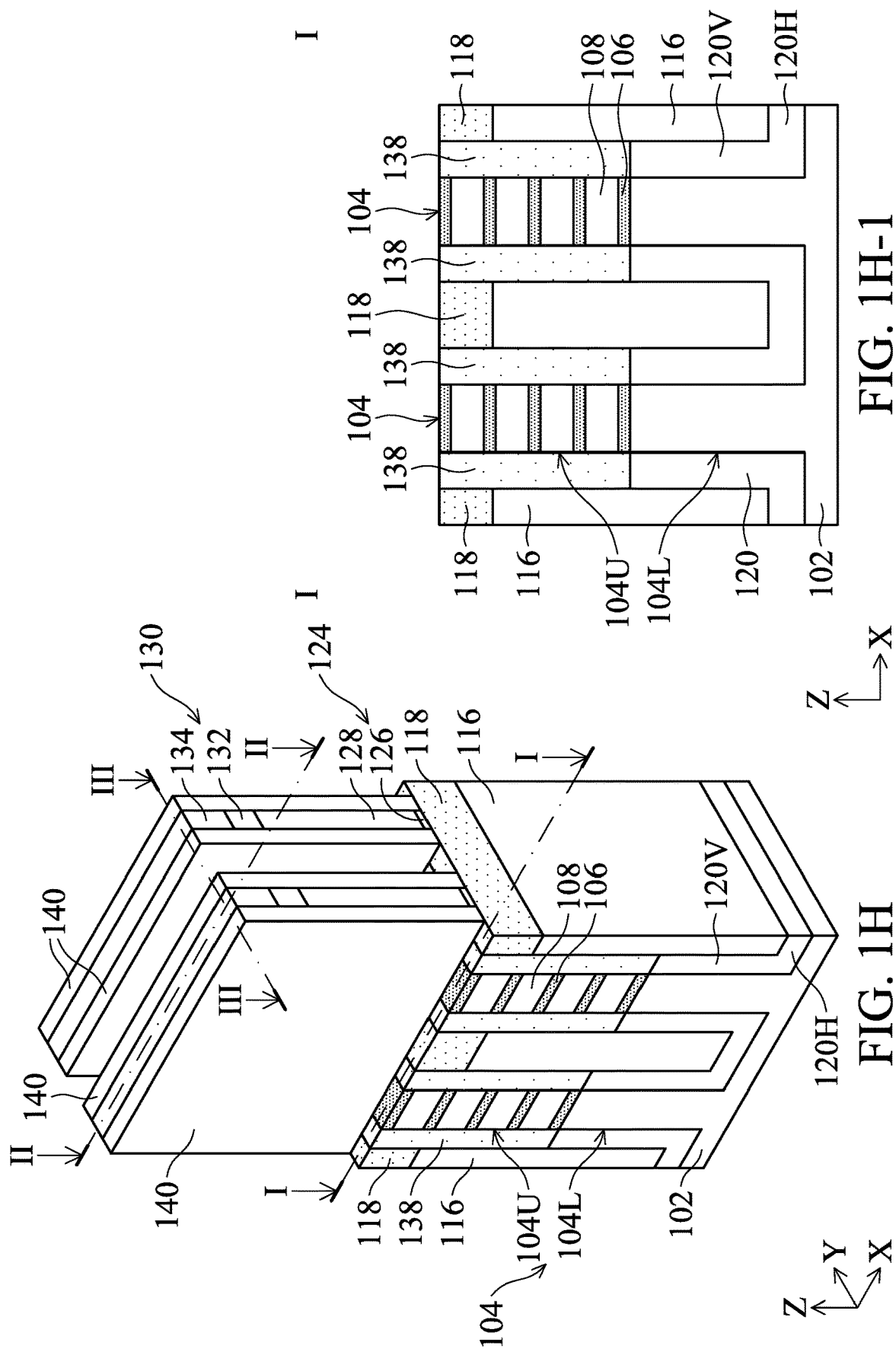

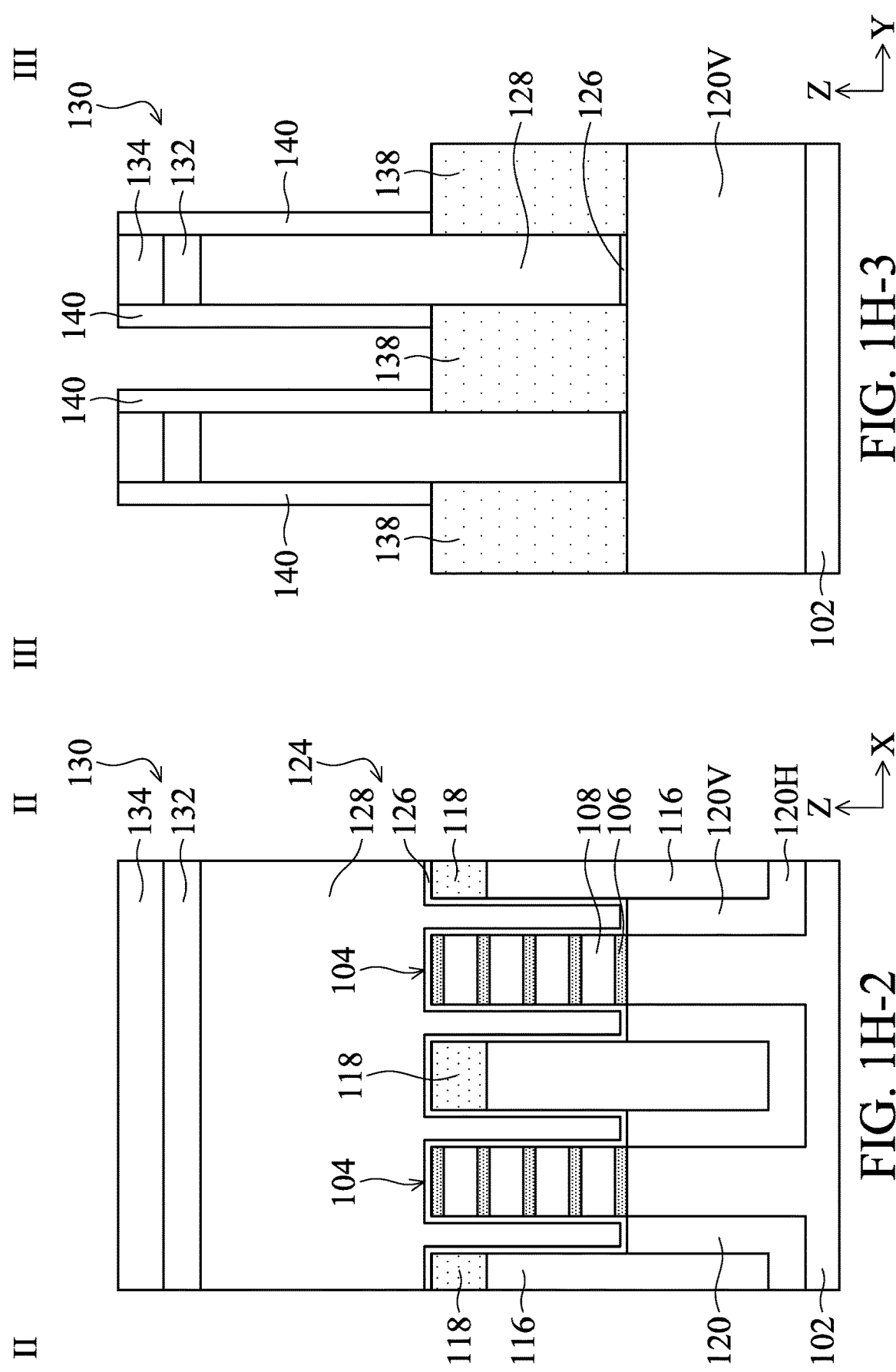

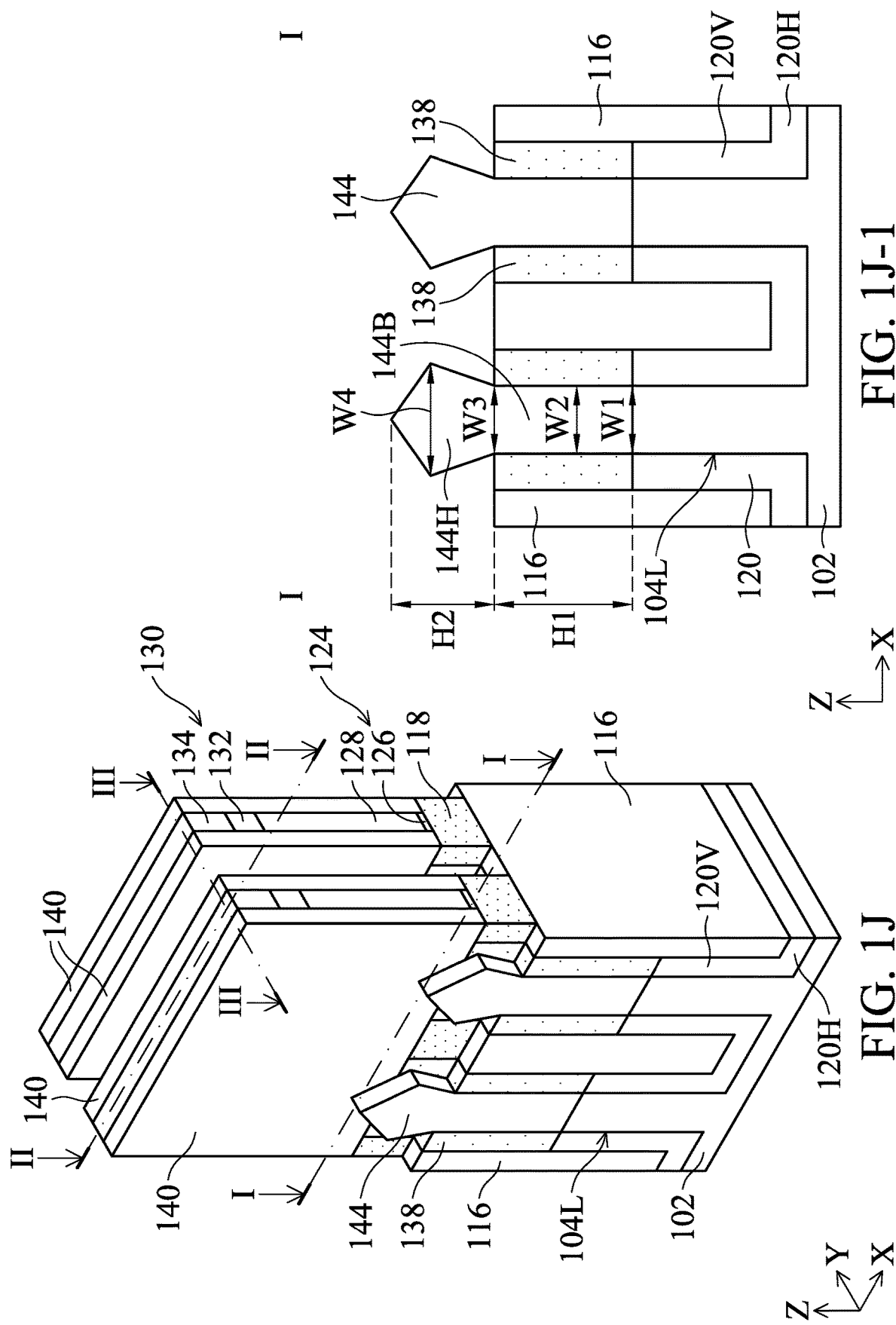

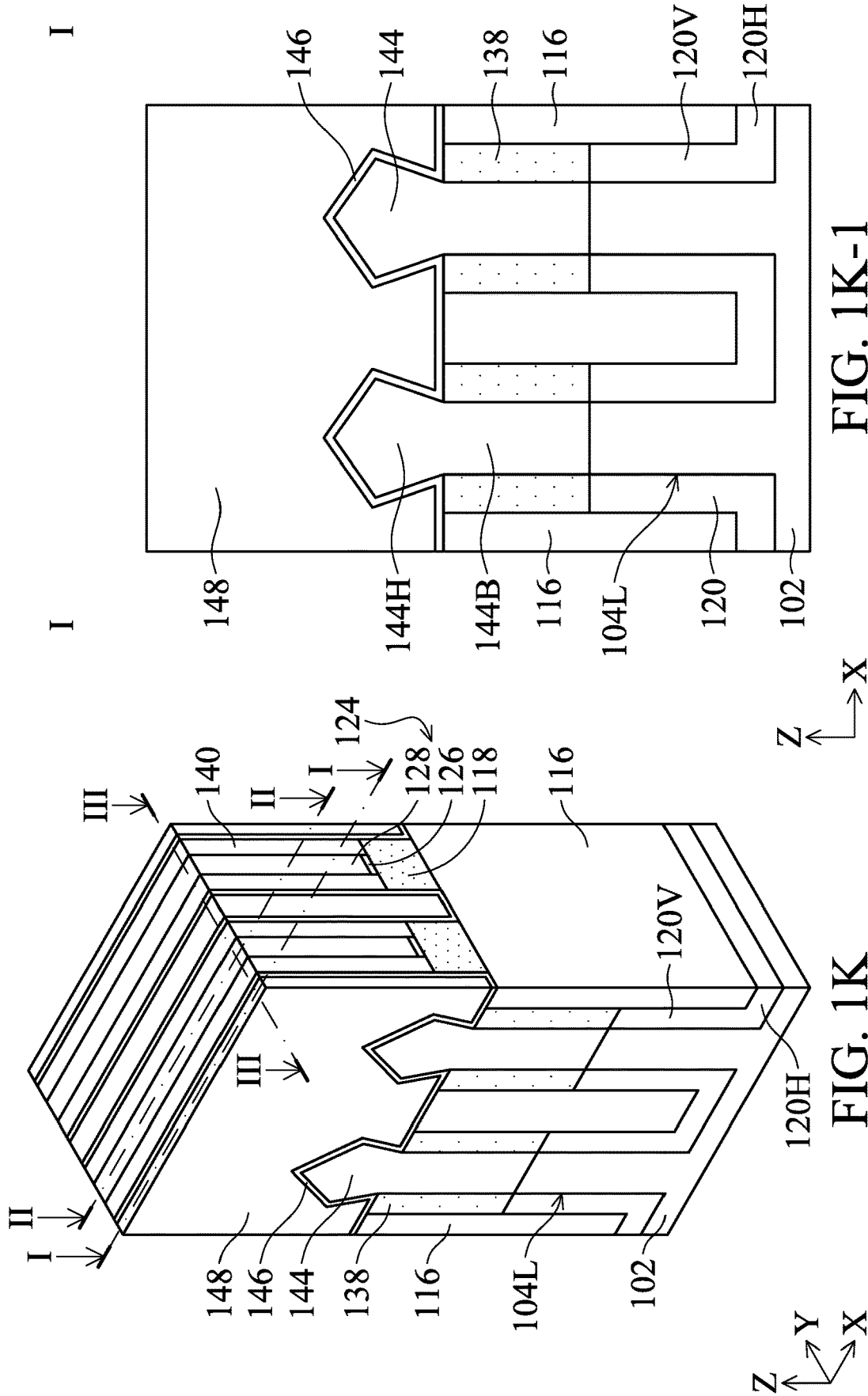

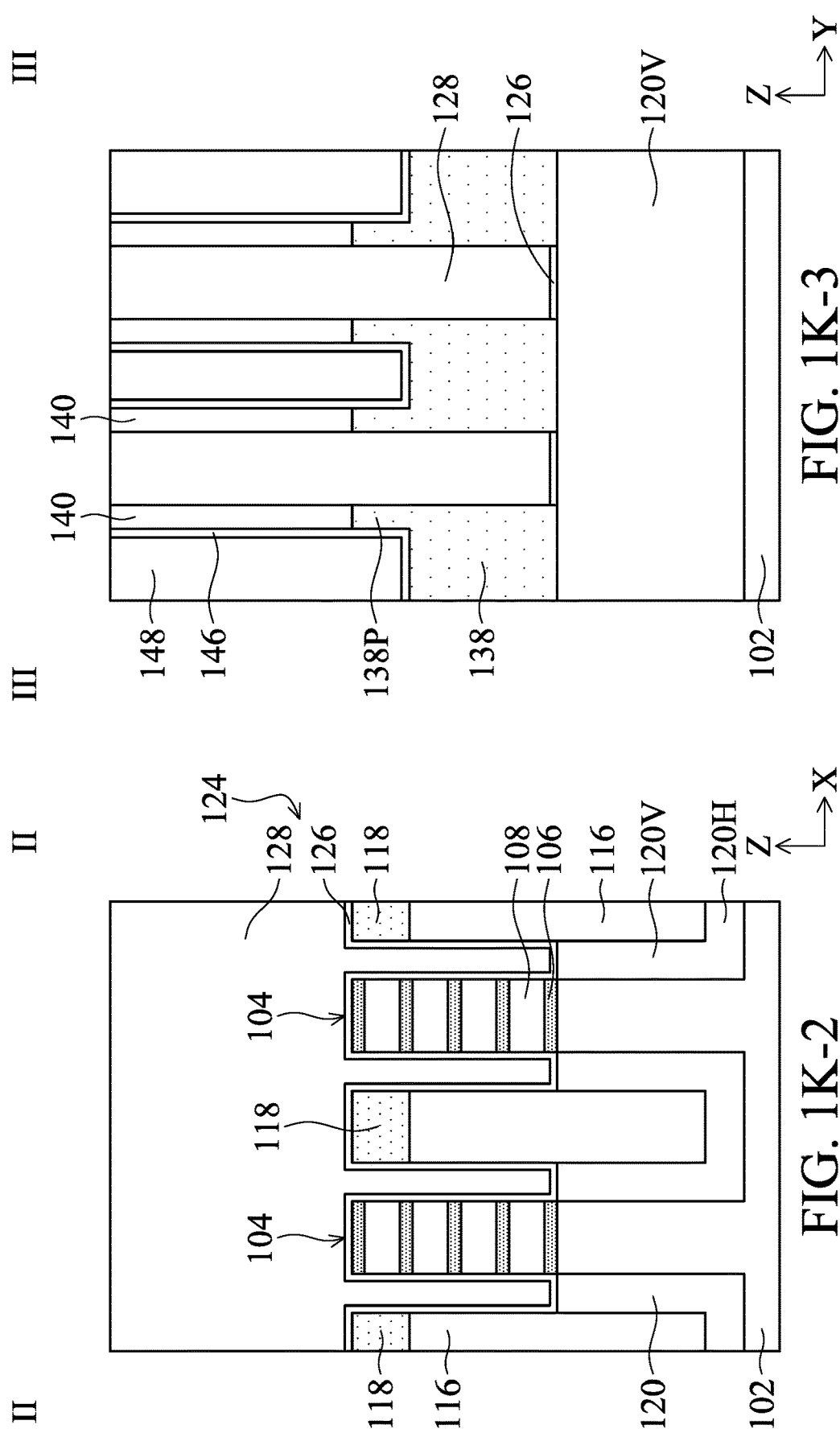

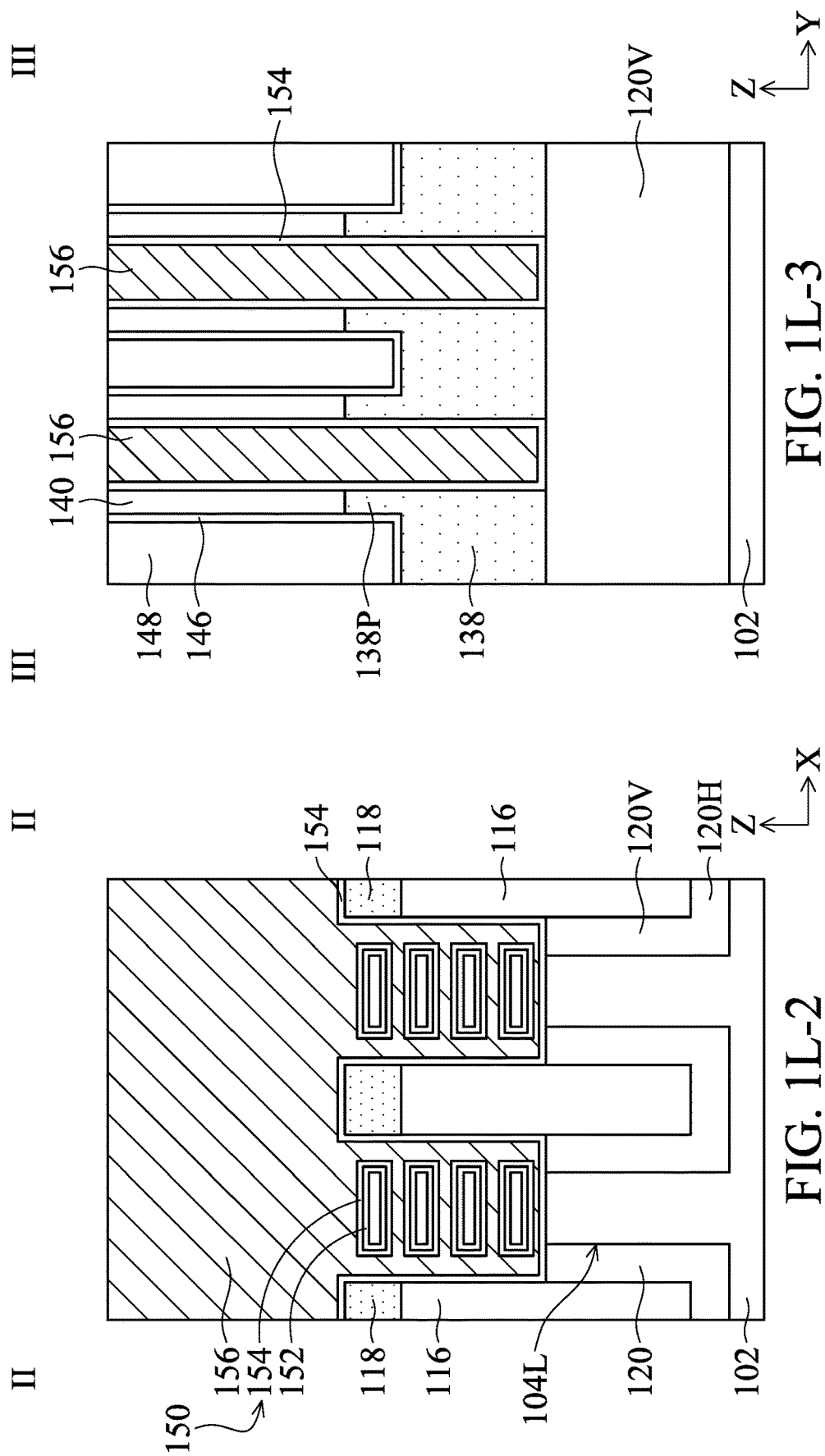

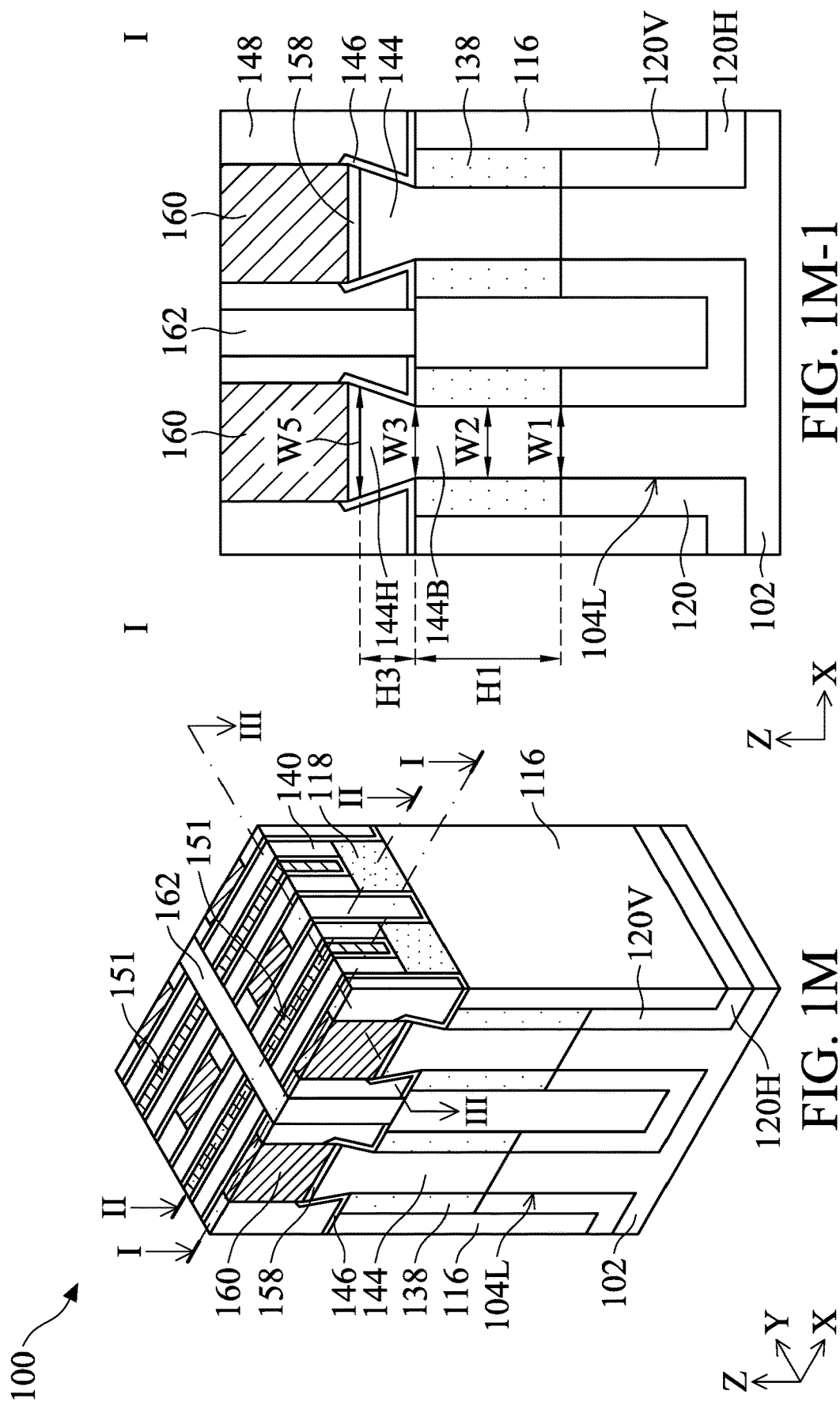

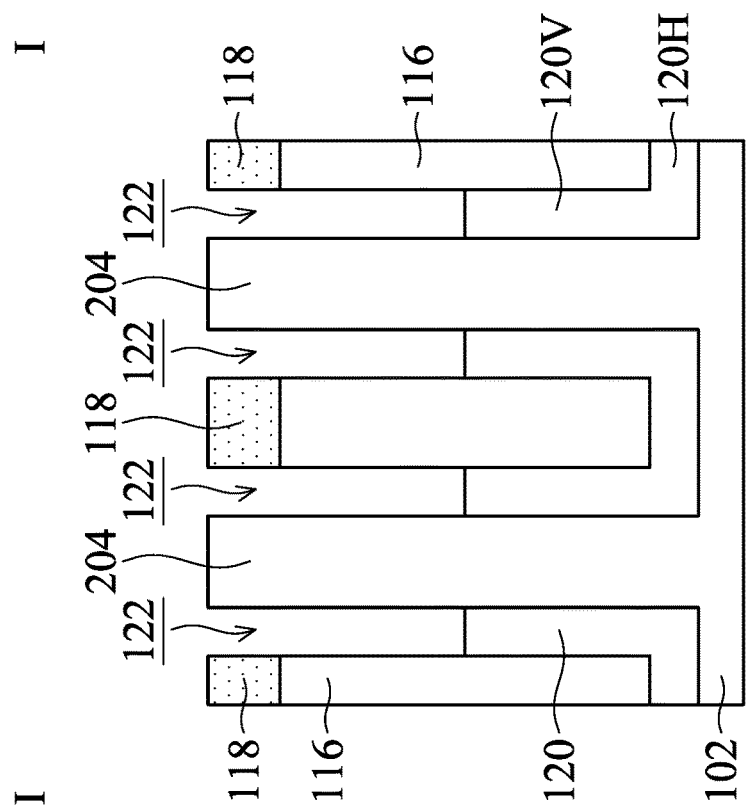
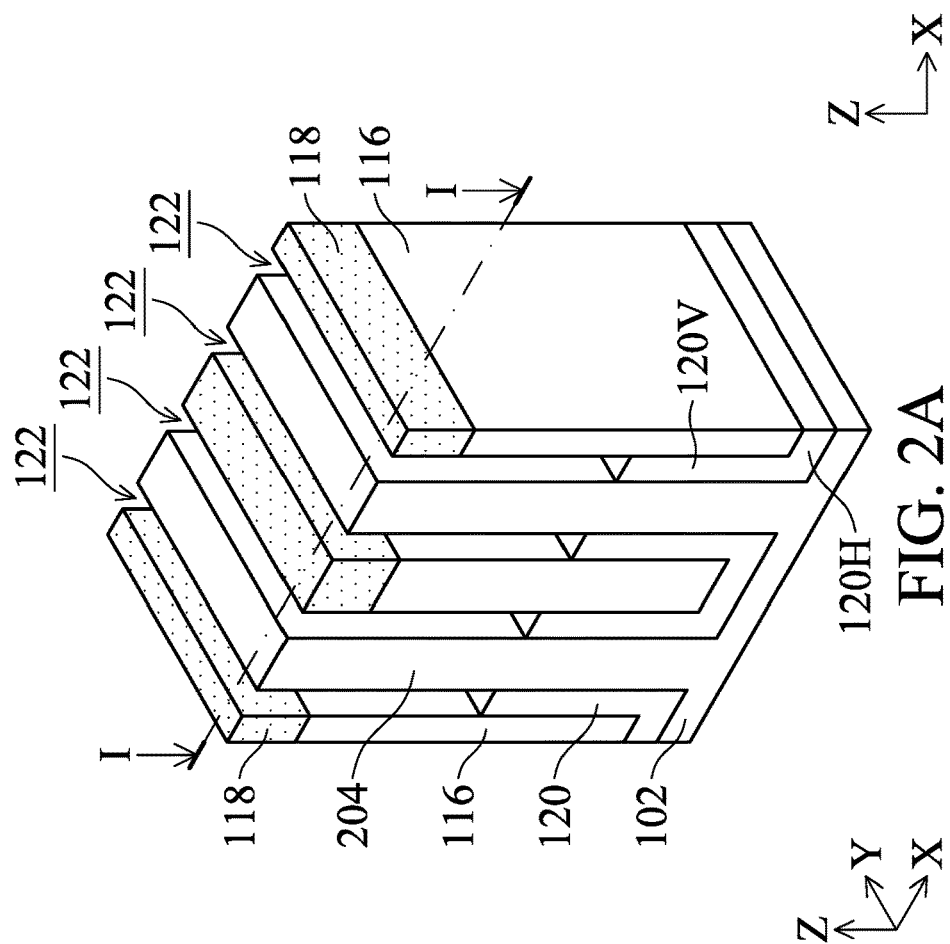

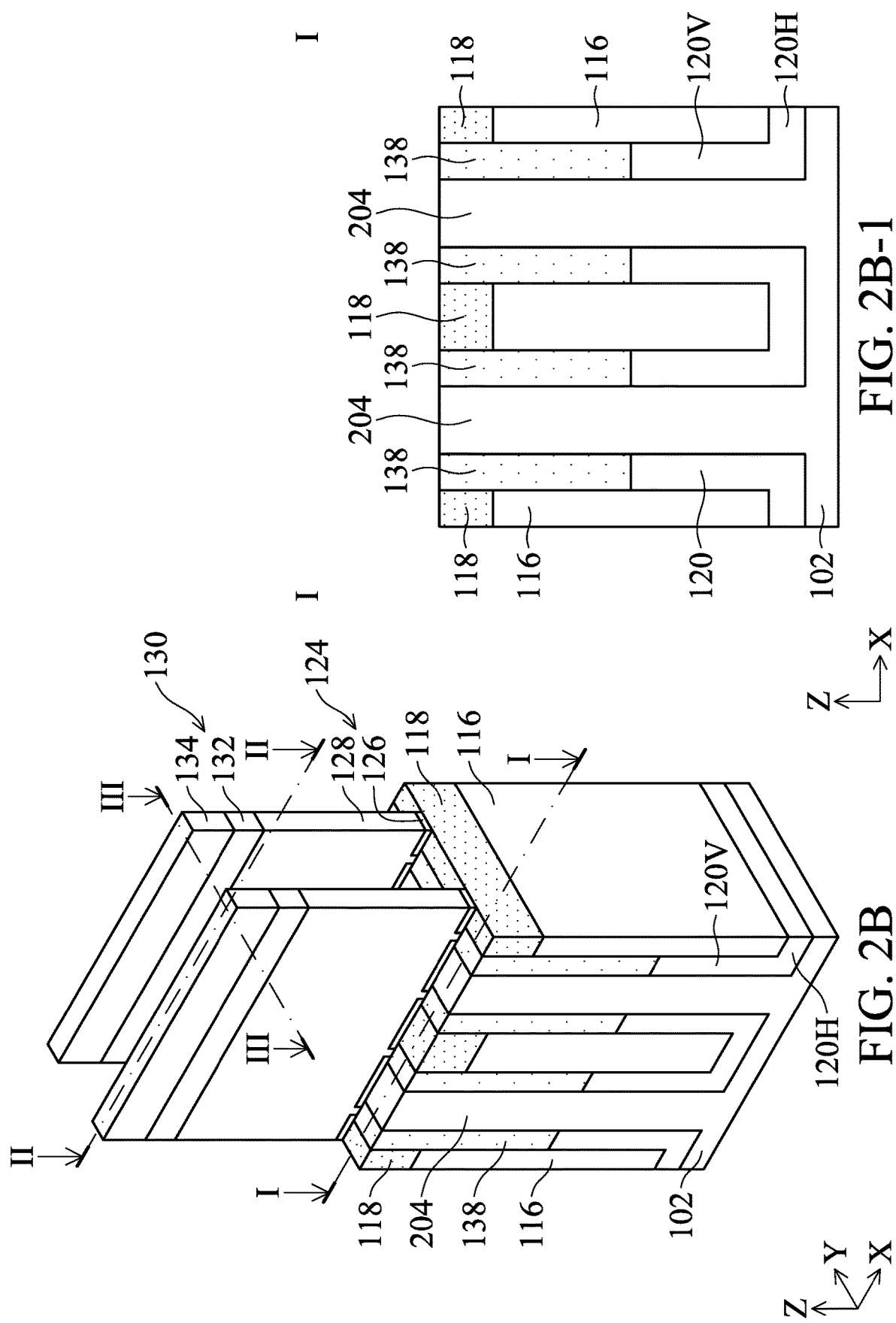

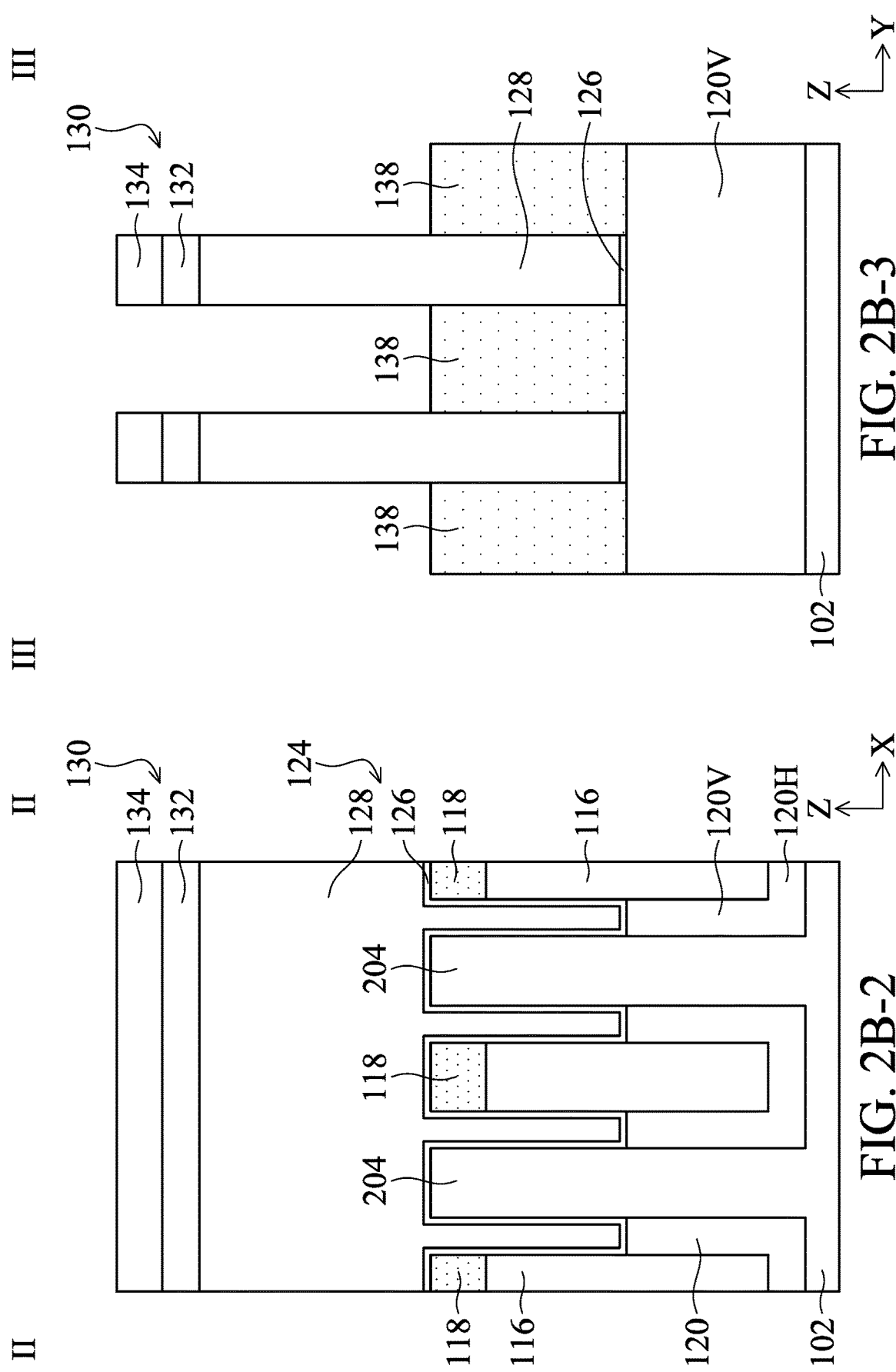

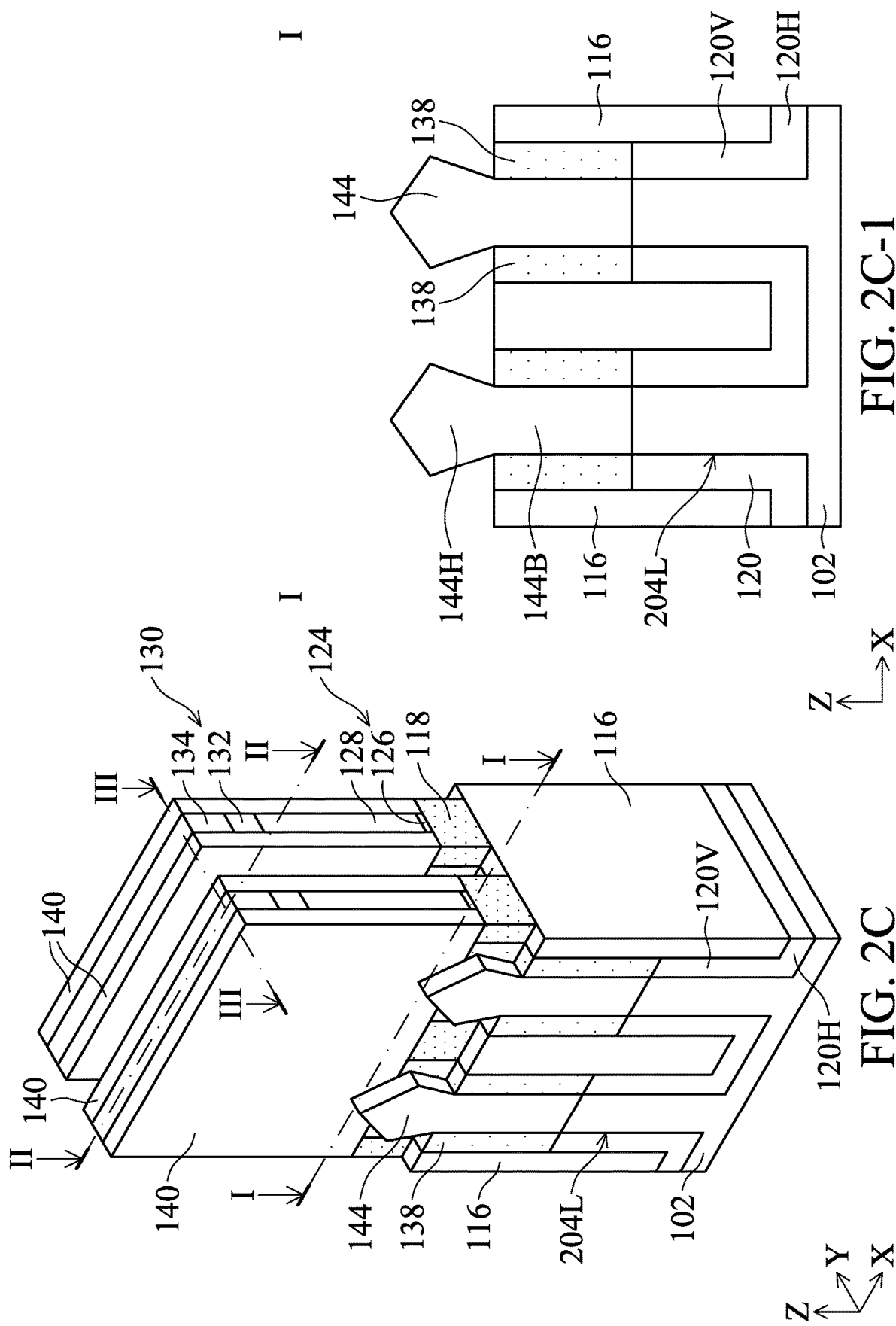

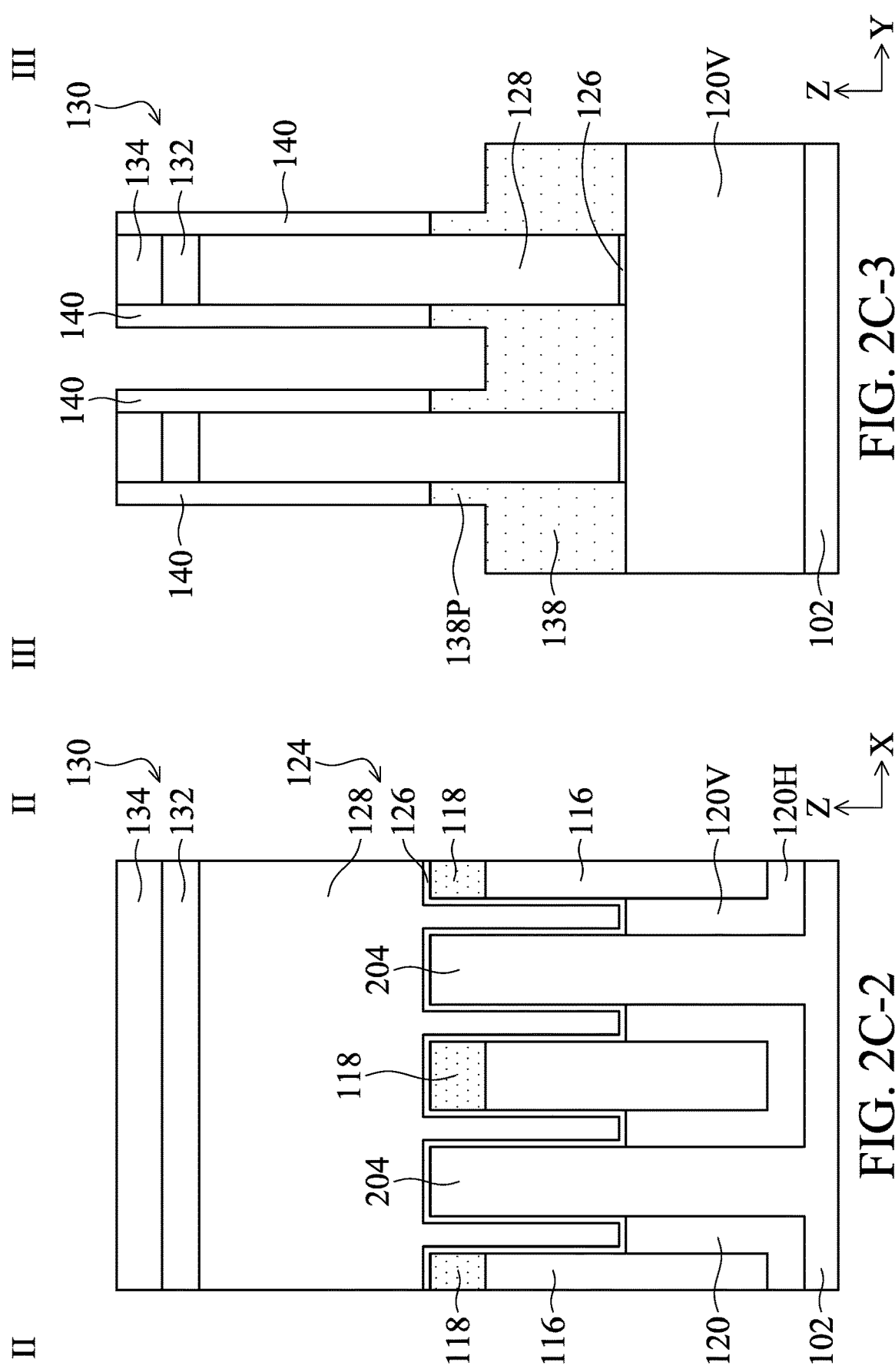

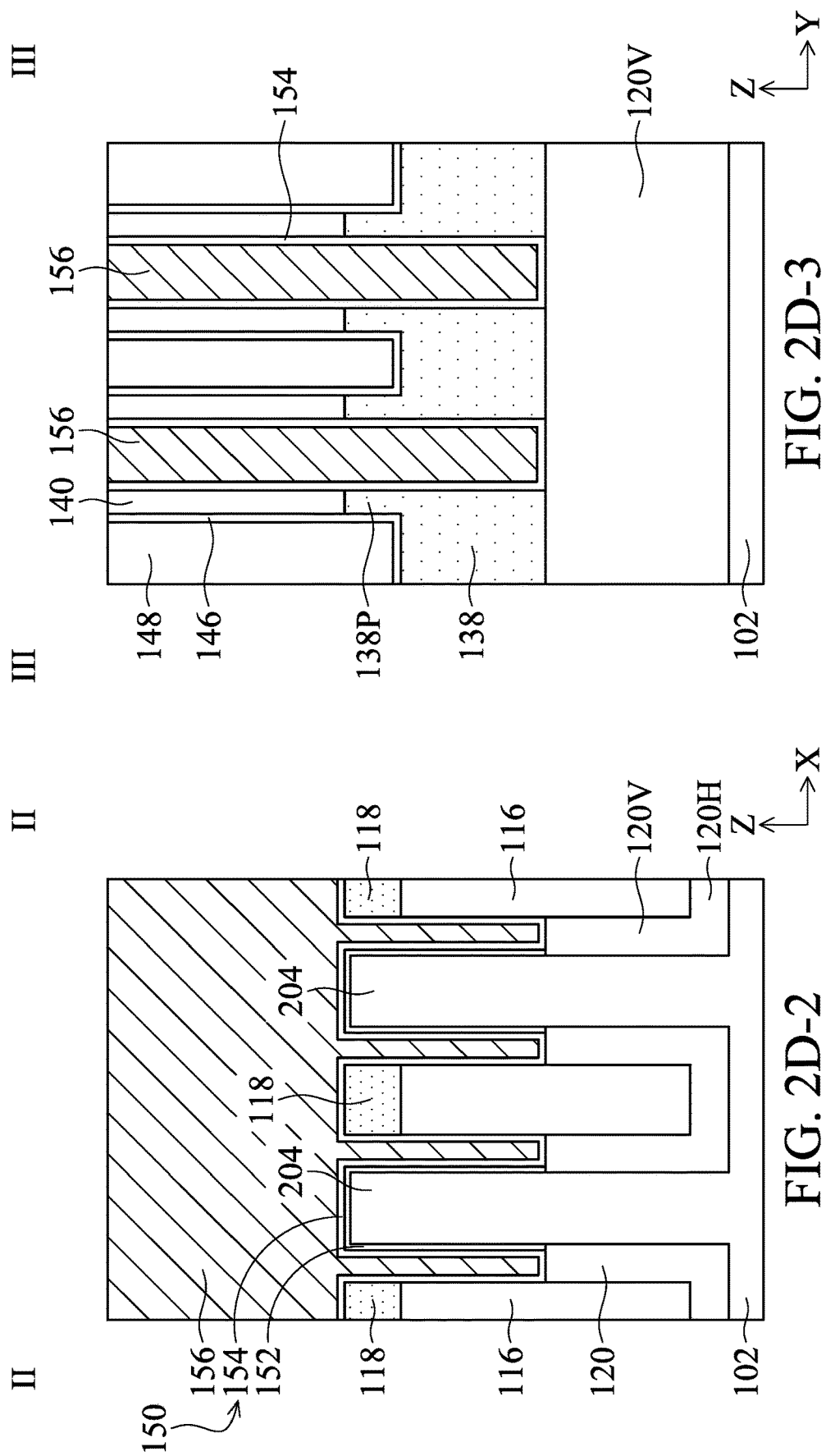

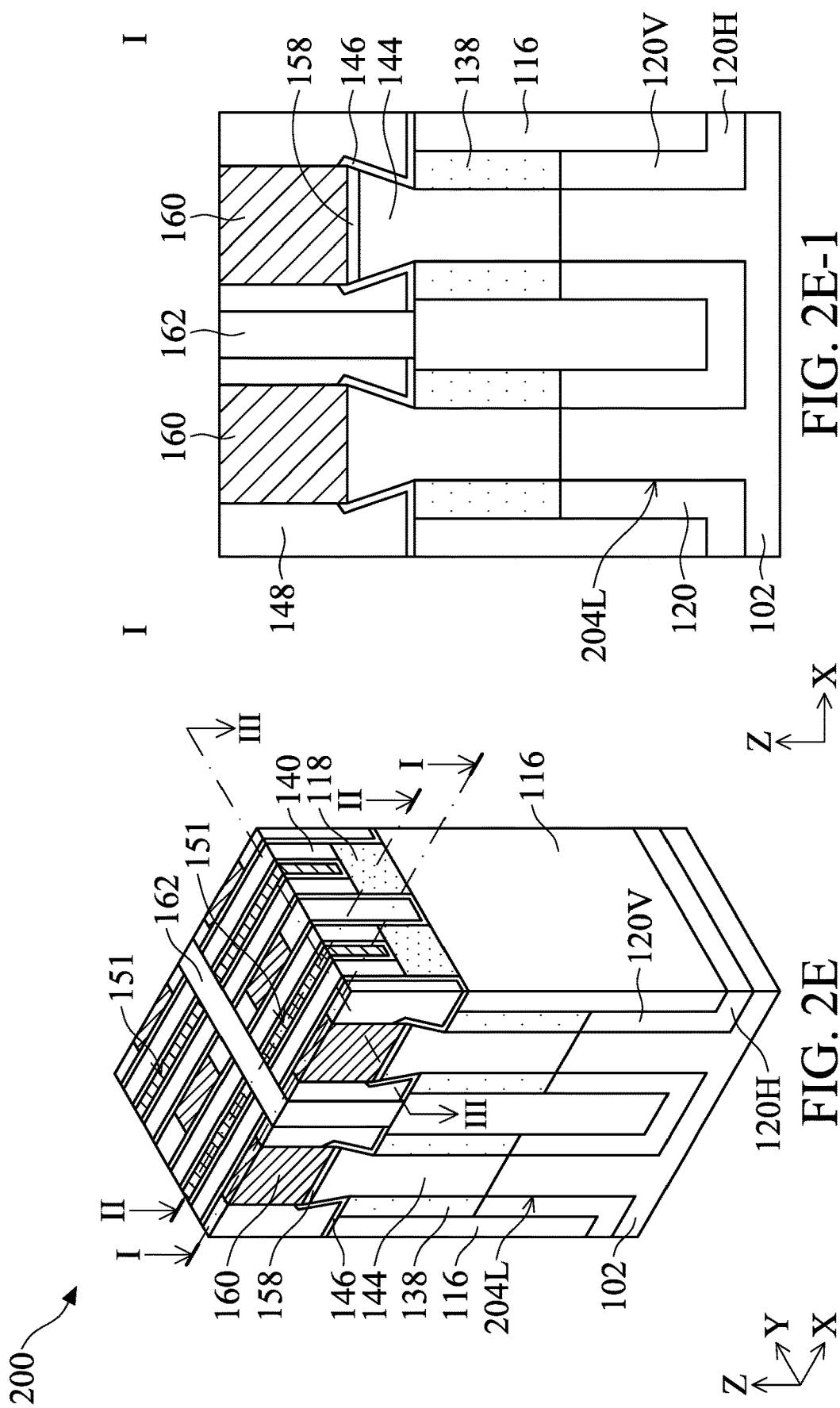

SEMICONDUCTOR DEVICE STRUCTURE AND METHOD FOR FORMING THE SAME

PRIORITY CLAIM

This application is a Continuation of pending U.S. patent application Ser. No. 16/395,731, filed on Apr. 26, 2019 and entitled "SEMICONDUCTOR DEVICE STRUCTURE AND METHOD FOR FORMING THE SAME", the entire of which is incorporated by reference herein.

BACKGROUND

The electronics industry is experiencing an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes and their structure allows them to be aggressively scaled-down while maintaining gate control and mitigating SCEs. In conventional processes, GAA devices provide a channel in a silicon nanowire. However, integration of fabrication of the GAA features around the nanowire can be challenging. For example, while the current methods have been satisfactory in many respects, continued improvements are still needed.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 1A-1M are perspective views illustrating the formation of a semiconductor device at various intermediate stages, in accordance with some embodiments of the disclosure.

FIGS. 1A-1 through 1M-1 are cross-sectional views of semiconductor structures along line I-I in FIGS. 1A-1M, in accordance with some embodiments of the disclosure.

FIGS. 1E-2 through 1M-2 are cross-sectional views of semiconductor structures along line II-II in FIGS. 1A-1M, in accordance with some embodiments of the disclosure.

FIGS. 1F-3 through 1M-3 are cross-sectional views of semiconductor structure along line in FIGS. 1A-1M, in accordance with some embodiments of the disclosure.

FIGS. 2A-2E are perspective views illustrating the formation of a semiconductor device at various intermediate stages, in accordance with some embodiments of the disclosure.

FIGS. 2A-1 through 2E-1 are cross-sectional views of semiconductor structures along line I-I in FIGS. 2A-2E, in accordance with some embodiments of the disclosure.

FIGS. 2B-2 through 2E-2 are cross-sectional views of semiconductor structures along line II-II in FIGS. 2A-2E, in accordance with some embodiments of the disclosure.

FIGS. 2B-3 through 2E-3 are cross-sectional views of semiconductor structures along line in FIGS. 2A-2E in accordance with some embodiments of the disclosure.

DETAILED DESCRIPTION

Figures 1, 1A:
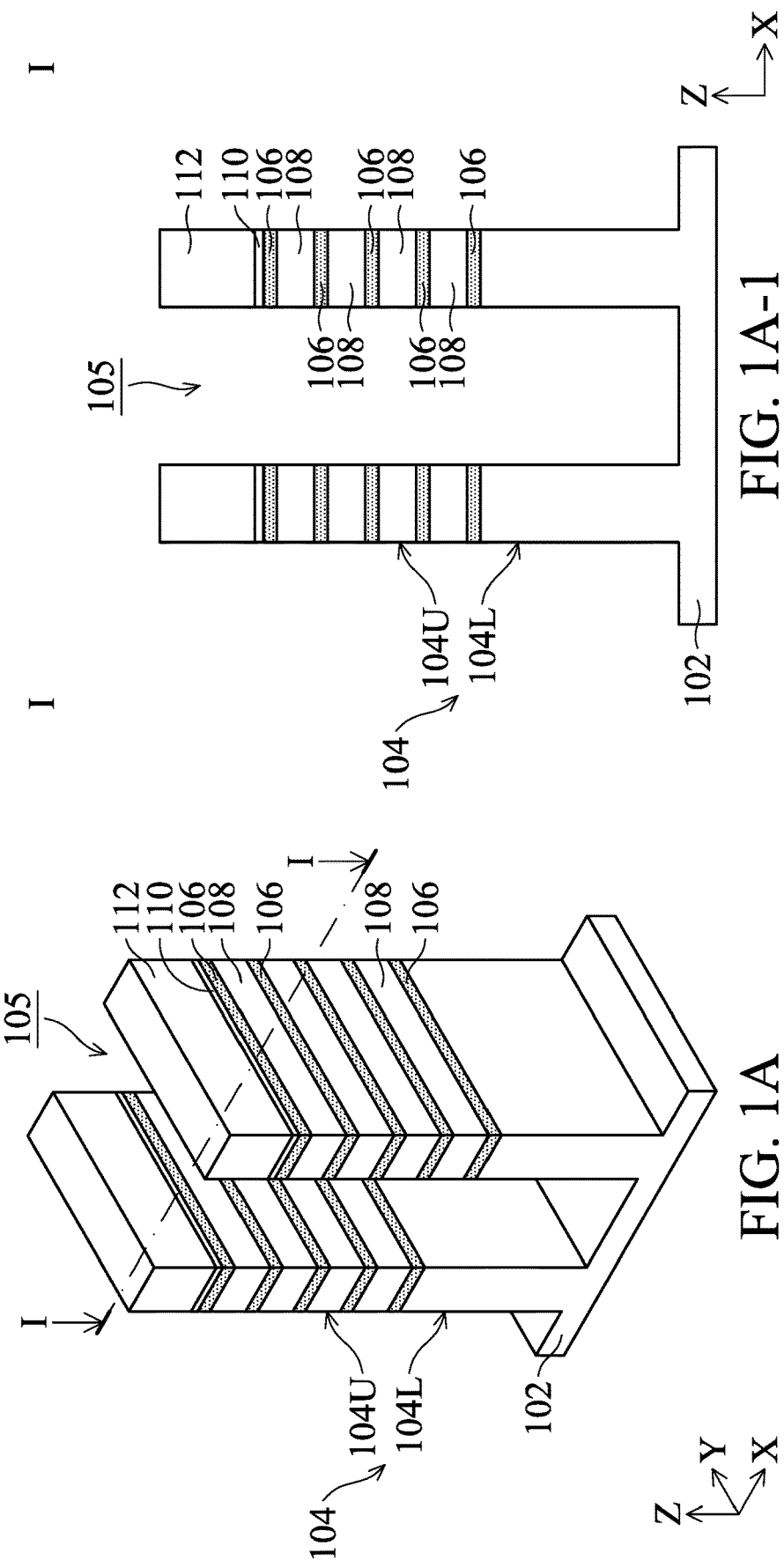

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of a semiconductor device structure are provided. The semiconductor device structure may include a semiconductor fin structure, an isolation structure, source/drain spacers, and a source/drain feature. The isolation structure includes a vertical portion surrounding the semiconductor fin structure. The source/drain spacers are formed directly above the vertical portion of the isolation structure. The source/drain feature is interposed between the source/drain spacers. Because the source/drain spacers confine the lateral growth of the source/drain feature, the source/drain feature can be formed to have a narrower width. As a result, the parasitic capacitance of the semiconductor device can be reduced, thereby enhancing the operation speed of the semiconductor device.

FIGS. 1A-1M are perspective views illustrating the formation of a semiconductor device 100 at various intermediate stages, in accordance with some embodiments of the disclosure. FIGS. 1A-1 through 1M-1 are cross-sectional views of semiconductor structures along line I-I in FIGS. 1A-1M, in accordance with some embodiments of the disclosure. FIGS. 1E-2 through 1M-2 are cross-sectional views of semiconductor structures along line II-II in FIGS. 1A-1M, in accordance with some embodiments of the disclosure. FIGS. 1F-3 through 1M-3 are cross-sectional views of semiconductor structures along line in FIGS. 1A-1M, in accordance with some embodiments of the disclosure.

A substrate 102 is provided, as shown in FIGS. 1A and 1A-1, in accordance with some embodiments. Semiconductor fin structures 104 are formed over the substrate 102, in accordance with some embodiments.

In some embodiments, the substrate 102 is a semiconductor substrate such as a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof.

In some embodiments, the substrate 102 includes an epitaxial layer (epi-layer) formed thereon. In some embodiments, the substrate 102 is a semiconductor-on-insulator (SOI) substrate which includes a semiconductor substrate, a buried oxide layer over the substrate, and a semiconductor layer over the buried oxide layer.

The semiconductor fin structures 104 are arranged in the X direction and extend in the Y direction, in accordance with some embodiments. The semiconductor fin structures 104 each include a lower portion 104L and an upper portion 104U, in accordance with some embodiments. The lower portion 104L of the semiconductor fin structure 104 is formed by a portion of the substrate 102, in accordance with some embodiments. The upper portion 104U of the semiconductor fin structure 104 is formed by a stacked semiconductor structure, which includes first semiconductor layers 106 and second semiconductor layers 108 alternately stacked over the lower portion 104L, in accordance with some embodiments.

As explained in detail below, the first semiconductor layers 106 of the semiconductor fin structures 104 will be removed so that the second semiconductor layers 108 of the semiconductor fin structures 104 form nanowire structures which extend between source/drain features, in accordance with some embodiments. The nanowire structure of the second semiconductor layers 108 will be surrounded by a gate stacks to serve as a channel region of the semiconductor device, in accordance with some embodiments. For example, the embodiments described in FIGS. 1A through 1M-3 illustrate processes and materials that may be used to form nanowire structures with a GAA design for n-type FinFETs and/or p-type FinFETs.

In some embodiments, the formation of the semiconductor fin structures 104 includes forming a stacked semiconductor structure including a first semiconductor material for the first semiconductor layers 106 and a second semiconductor material for the second semiconductor layers 108 over the substrate 102.

The first semiconductor material for the first semiconductor layers 106 is a material having a different lattice constant than that of the second semiconductor material for the second semiconductor layers 108, in accordance with some embodiments. In some embodiments, the first semiconductor layers 106 are made of SiGe, where the percentage of germanium (Ge) in the SiGe is in the range from about 20 atomic % to about 50 atomic %, and the second semiconductor layers 108 are made of silicon. In some embodiments, the first semiconductor layers 106 are $Si_{1-x}Ge_x$, where x is more than about 0.3, or Ge (x=1.0) and the second semiconductor layers 108 are Si or $Si_{1-y}Ge_y$, where y is less than about 0.4, and x>y.

In some embodiments, the first semiconductor material and the second semiconductor material are formed using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

In some embodiments, the thickness of each of the first semiconductor layers 106 is in a range from about 1.5 nanometers (nm) to about 20 nm. In some embodiments, the first semiconductor layers 106 are substantially uniform in thickness. In some embodiments, the thickness of each of the second semiconductor layers 108 is in a range from about 1.5 nm to about 20 nm. In some embodiments, the second semiconductor layers 108 are substantially uniform in thickness.

Afterward, the stacked semiconductor structure including the first semiconductor material and the second semiconductor material and the underlying substrate 102 are patterned into the fin structures 104.

In some embodiments, the patterning process includes forming bi-layered hard mask layers (including hard mask layers 110 and 112) over the stacked semiconductor structure, and etching the stacked semiconductor structure and the underlying substrate 102 through the bi-layered hard mask layers. In some embodiments, the first hard mask layer 110 is a pad oxide layer made of a silicon oxide, which is formed by thermal oxidation or CVD. In some embodiments, the second hard mask layer 112 is made of silicon nitride, which is formed by CVD, such as LPCVD or plasma-enhanced CVD (PECVD).

In some embodiments, the etching process of the patterning process removes portions of the stacked semiconductor structure uncovered by the bi-layered hard mask layers and further recesses the substrate 102 so as to form trenches 105.

In some embodiments, after the etching process, the substrate 102 has portions which protrude from between the trenches 105 to form the lower portions 104L of the semiconductor fin structures 104. In some embodiments, remaining portions of the stacked semiconductor structure directly above the lower portions 104L form the upper portions 104U of the semiconductor fin structures 104.

Figures 1, 1B:
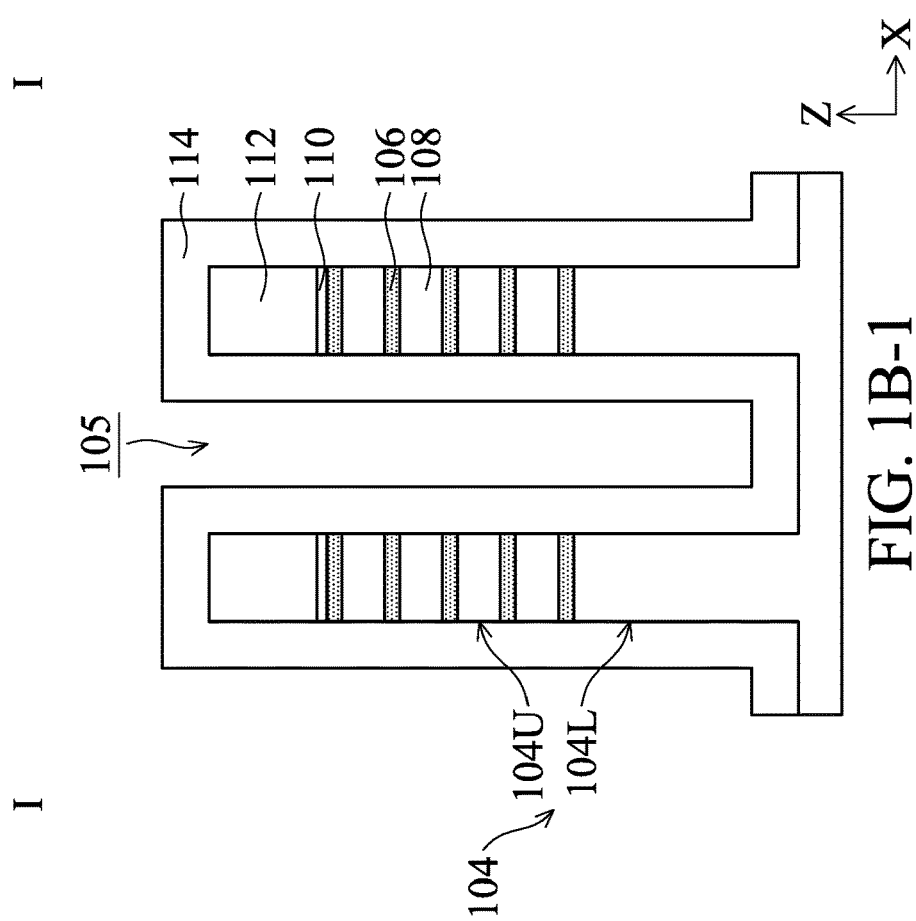
Figure 1B:
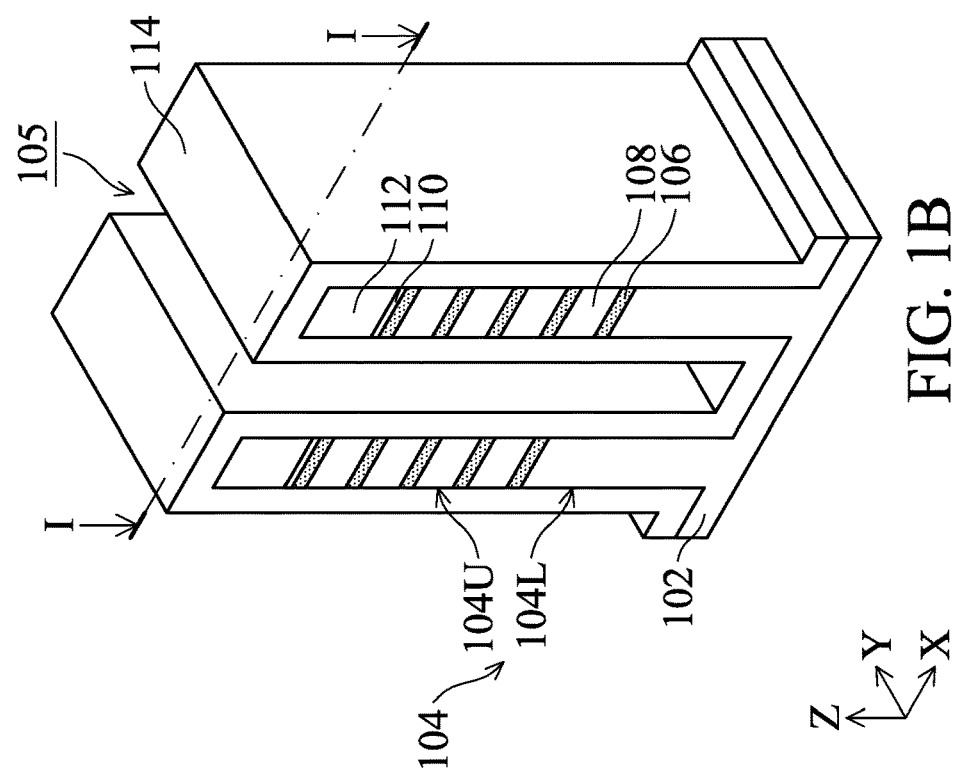

An insulating material 114 is conformally formed along the semiconductor fin structures 104 and the substrate 102, as shown in FIGS. 1B and 1B-1, in accordance with some embodiments. The insulating material 114 is further formed along the bi-layered hard mask layers, in accordance with some embodiments. The insulating material 114 covers the upper surface of the substrate 102, the sidewalls of the semiconductor fin structures 104, and upper surfaces and sidewalls of the bi-layered hard mask layers, in accordance with some embodiments. The trenches 105 are partially filled by the insulating material 114, in accordance with some embodiments.

In some embodiments, the insulating material 114 includes silicon oxide, silicon nitride, silicon oxynitride (SiON), another suitable insulating material, or a combination thereof. In some embodiments, the insulating material is formed using LPCVD, PECVD, high density plasma CVD (HDP-CVD), high aspect ratio process (HARP), flowable CVD (FCVD), ALD, another suitable method, or a combination thereof.

Dielectric fin structures 116 are formed to fill remaining portions of the trenches 105, as shown in FIGS. 1C and 1C-1, in accordance with some embodiments. The dielectric fin structures 116 are formed adjacent to the semiconductor fin structures 104 and over the insulating material 114, in accordance with some embodiments. The dielectric fin structures 116 are spaced apart from the semiconductor fin structures 104 by the insulating material 114, in accordance with some embodiments. The dielectric fin structures 116 are arranged in the X direction and extend in the Y direction, in accordance with some embodiments. In some embodiments, the dielectric fin structures 116 have the upper surfaces at a level below the upper surfaces of the semiconductor fin structures 104.

In some embodiments, the dielectric fin structures 116 are made of a dielectric material with a dielectric constant less than about 7. In some embodiments, the dielectric material for the dielectric fin structures 116 is SiN SiCN, SiOC, SiOCN, or a combination thereof. In some embodiments, the formation of the dielectric fin structures 116 includes depositing a dielectric material over the insulating material 114 and filling the trenches 105 followed by an etch-back process. In some embodiments, the deposition process is LPCVD, PECVD, HDP-CVD, HARP, FCVD, ALD, another suitable method, or a combination thereof. In some embodiments, the etch-back process is an isotropic etching process such a dry chemical etching or wet etching, or an anisotropic etching process such as dry plasma etching.

Protection layers 118 are formed to fill remaining portions of the trenches 105, as shown in FIGS. 1C and 1C-1, in accordance with some embodiments. The protection layers 118 are formed directly above the dielectric fin structures 116 in the trenches 105, in accordance with some embodiments. The remaining portions of the trenches 105 are substantially entirely filled by the protection layers 118, in accordance with some embodiments.

In some embodiments, the protection layers 118 are made of a dielectric material with a dielectric constant greater than about 7. In some embodiments, the dielectric material for the protection layers 118 is $Al_2O_3$, $HfO_2$, $ZrO_2$, HfAlO, HfSiO, or a combination thereof. In some embodiments, the formation of the protection layers 118 includes depositing a dielectric material over the dielectric fin structures 116 and filling the trenches 105 followed by an etch-back process. In some embodiments, the deposition process is LPCVD, PECVD, HDP-CVD, HARP, FCVD, ALD, another suitable method, or a combination thereof. In some embodiments, the etch-back process is an isotropic etching process such a dry chemical etching or wet etching, or an anisotropic etching process such as dry plasma etching.

The insulating material 114 formed above the semiconductor fin structures 104 is removed to expose the upper surfaces of the semiconductor fin structures 104, as shown in FIGS. 1C and 1C-1, in accordance with some embodiments. The bi-layered hard mask layers (including layers 110 and 112) are also removed, in accordance with some embodiments. In some embodiments, the removal process is chemical mechanical polishing (CMP) process or an etch-back process. In some embodiments, after the planarization, the upper surfaces of the semiconductor fin structures 104, the insulating material 114, and the protection layers 118 are substantially coplanar, in accordance with some embodiments.

The insulating material 114 is recessed to form gaps 122, as shown in FIGS. 1D and 1D-1, in accordance with some embodiments. Each of the gaps 122 is formed between one semiconductor fin structure 104 and one dielectric fin structure 116, in accordance with some embodiments. The gaps 122 expose the sidewalls of the upper portions 104U of the semiconductor fin structures 104, the sidewalls of the dielectric fin structures 116 and the sidewalls of the protection layers 118, in accordance with some embodiments. In some embodiments, the recessing process includes a dry etching, wet etching, or a combination thereof.

After the recessing process, remaining portions of the insulating material 114 form an isolation structure 120, in accordance with some embodiments. The isolation structure 120 includes vertical portions 120V and horizontal portions 120H, in accordance with some embodiments.

The vertical portions 120V of the isolation structure 120 surround the lower portions 104L of the semiconductor fin structures 104, in accordance with some embodiments. The vertical portions 120V of the isolation structure 120 also surround the lower portions of the dielectric fin structures 116, in accordance with some embodiments. Each of the vertical portions 120V of the isolation structure 120 is interposed between one semiconductor fin structures 104 and one dielectric fin structures 116, in accordance with some embodiments.

The horizontal portions 120H of the isolation structure 120 extend along the upper surface of the substrate 102 between two neighboring semiconductor fin structures 104, in accordance with some embodiments. The dielectric fin structures 116 are formed over the horizontal portions 120H of the isolation structure 120, in accordance with some embodiments.

Figures 1, 1E:
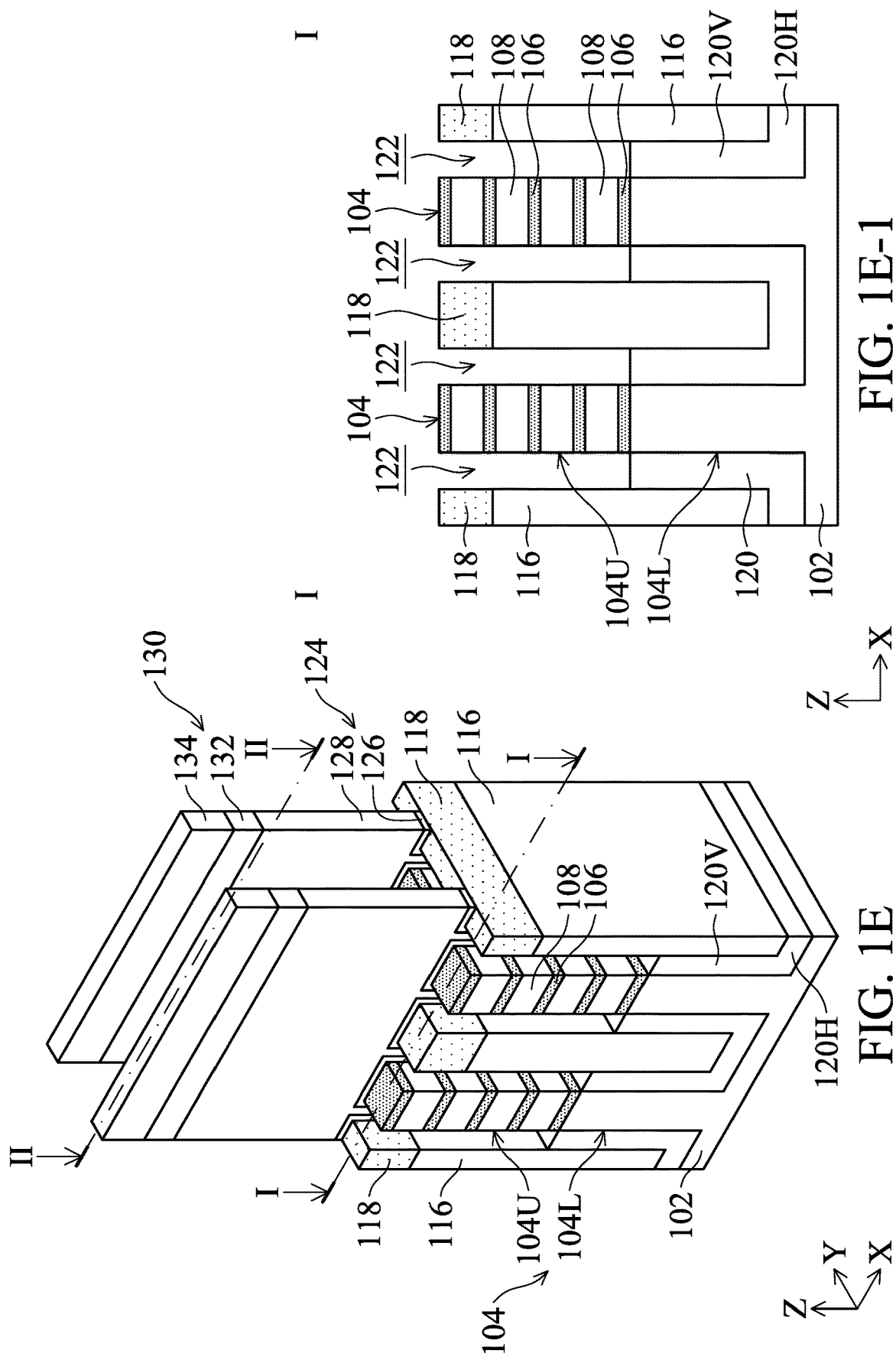
Figures 1, 1E, 2:
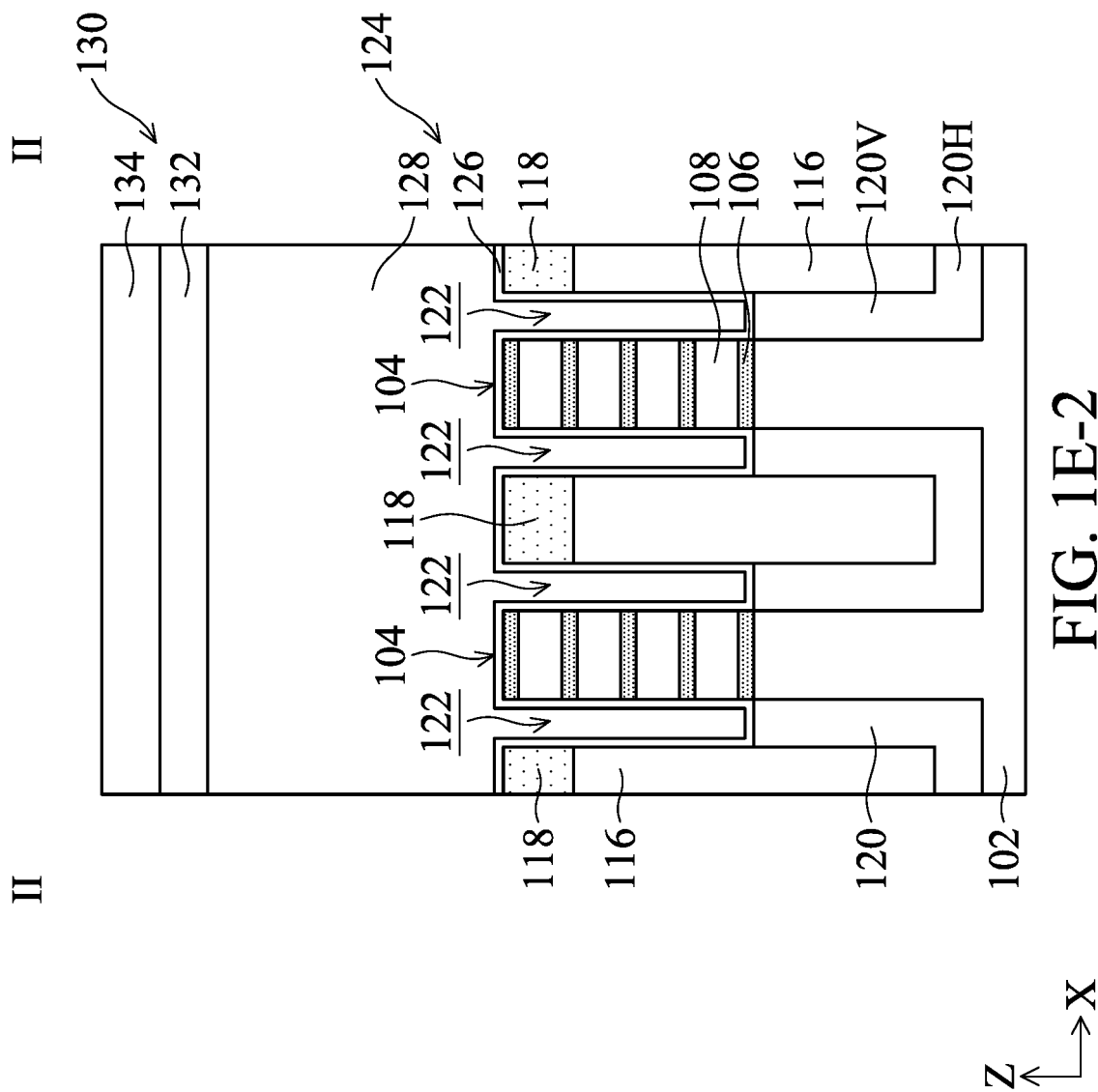
Figures 1, 1F:
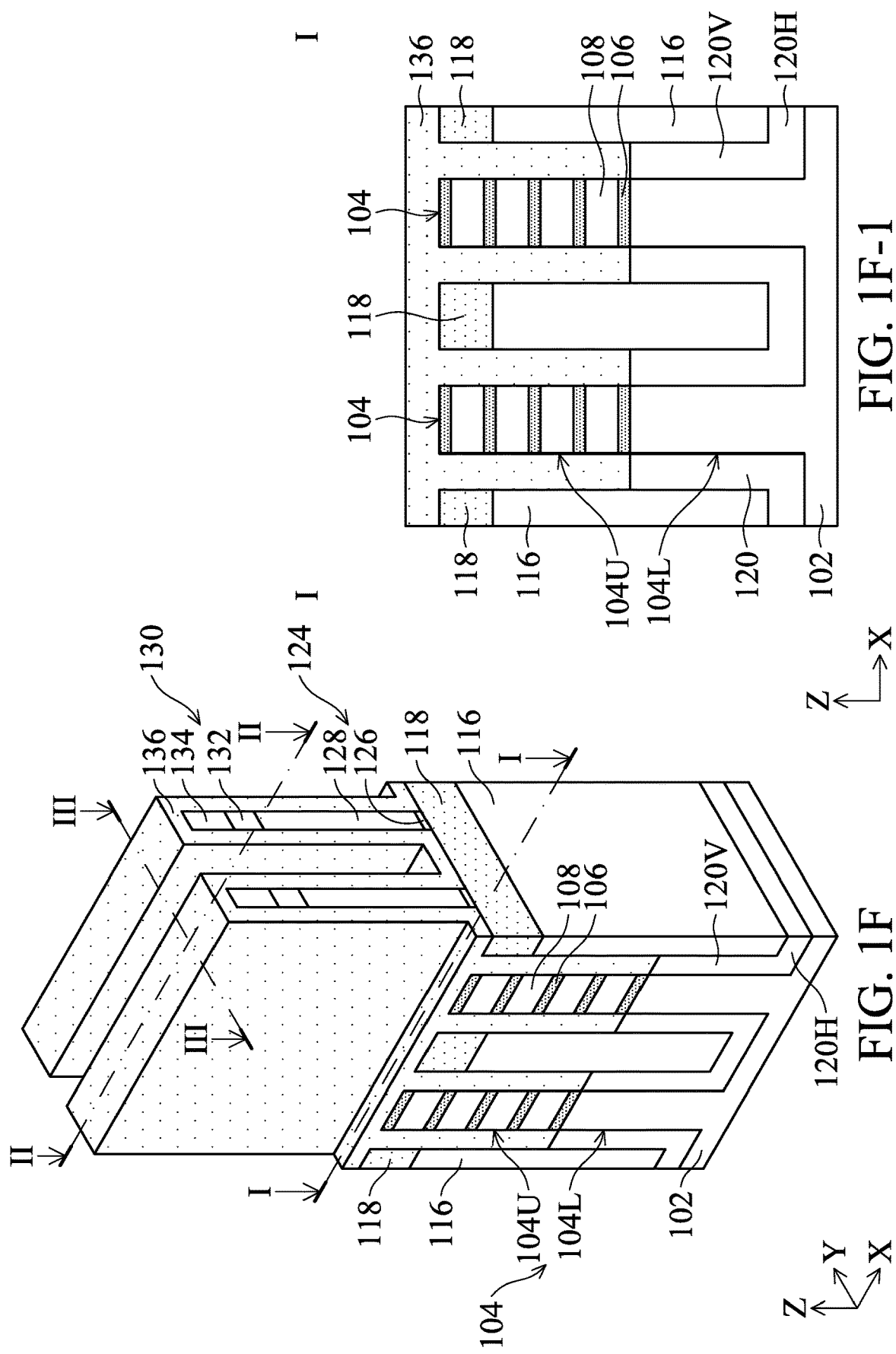
Figures 1, 1G:
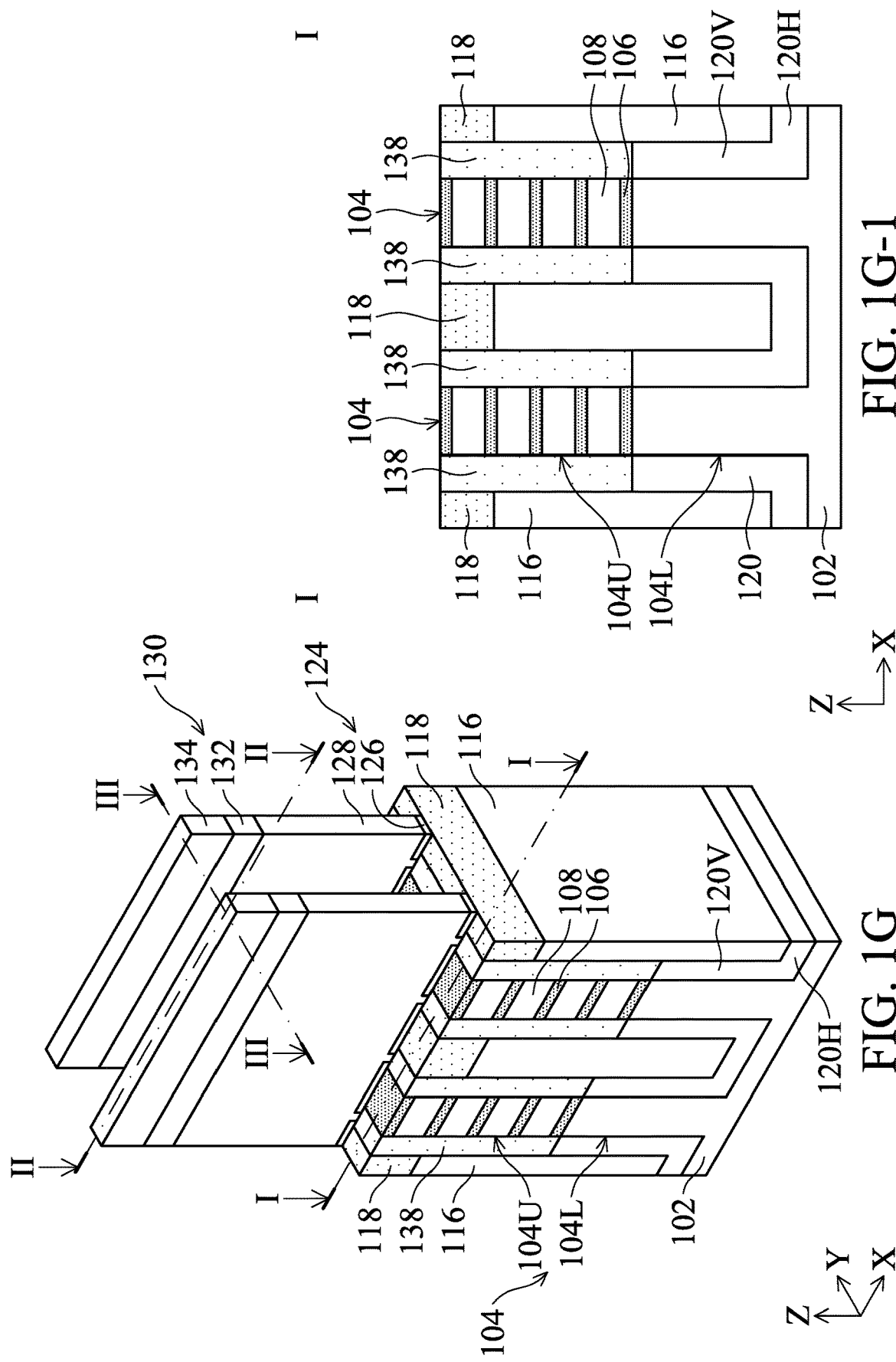
Figures 1, 1I:
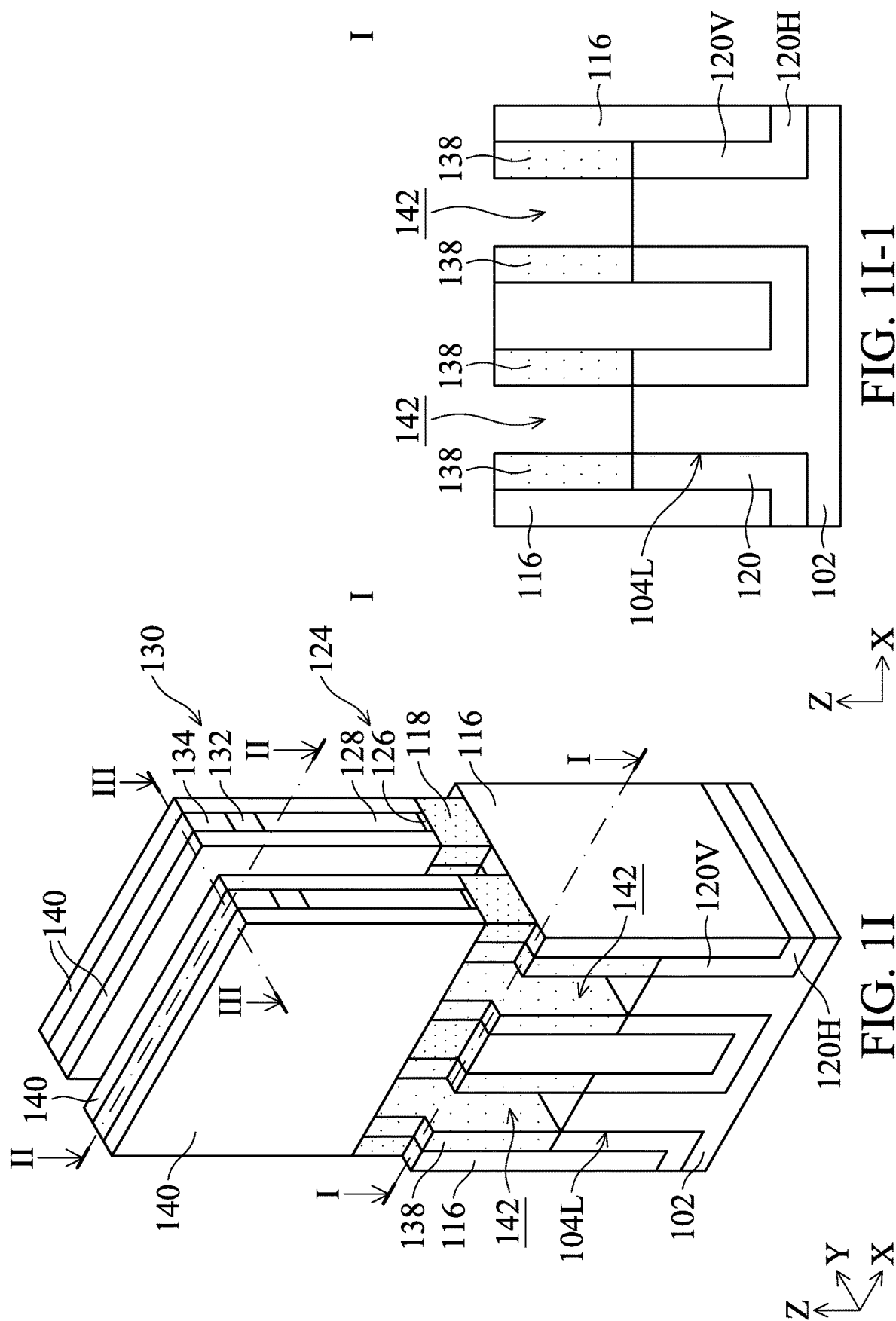
Figures 1, 1I, 2, 3:
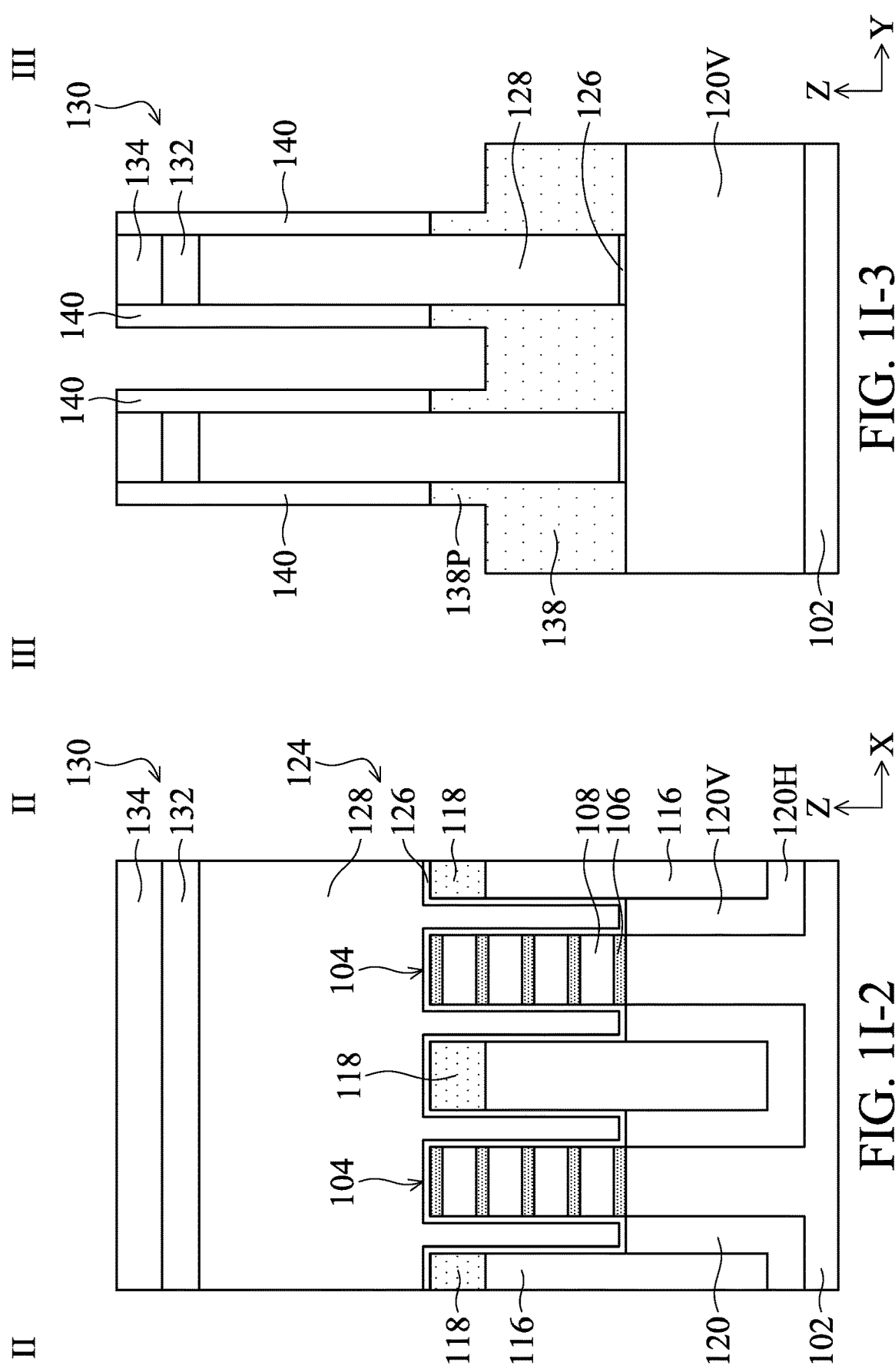

Dummy gate structures 124 are formed across the semiconductor fin structures 104 and the dielectric fin structures 116, as shown in FIGS. 1E, 1E-1 and 1E-2, in accordance with some embodiments. The dummy gate structures 124 are arranged in the Y direction and extend in the X direction, in accordance with some embodiments. The dummy gate structures 124 are filled into the gaps 122, in accordance with some embodiments. The dummy gate structures 124 cover the upper surfaces and the sidewalls of the semiconductor fin structures 104, the sidewalls of the dielectric fin structures 116, and the upper surfaces and the sidewalls of the protection layers 118, in accordance with some embodiments.

In some embodiments, the dummy gate structures 124 define the source/drain regions and the channel region of a semiconductor device.

The dummy gate structures 124 include dummy gate dielectric layers 126 and dummy gate electrode layers 128, in accordance with some embodiments. In some embodiments, the dummy gate dielectric layers 126 are made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dielectric material is formed using thermal oxidation, CVD, ALD, physical vapor deposition (PVD), another suitable method, or a combination thereof.

In some embodiments, the dummy gate electrode layers 128 are made of a conductive material. In some embodiments, the conductive material includes polycrystalline-silicon (poly-Si), poly-crystalline silicon-germanium (poly-SiGe), metallic nitrides, metallic silicides, metals, or a combination thereof. In some embodiments, the conductive material is formed using CVD, PVD, or a combination thereof.

In some embodiments, the formation of the dummy gate structures 124 includes conformally forming a dielectric material for the dummy gate dielectric layers 126 along the substrate 102, the semiconductor fin structures 104, the dielectric fin structures 116, and the protection layers 118; forming a conductive material for the dummy gate electrode layers 128 over the dielectric material; and forming bi-layered hard mask layers 130 over the conductive material.

In some embodiments, the formation of the bi-layered hard mask layers 130 includes forming an oxide layer (e.g., silicon oxide) over the conductive material, forming a nitride layer (e.g., silicon nitride) over the oxide layer, and patterning the oxide layer into layers 132 and the nitride layer into layers 134 using photolithography and etching processes.

In some embodiments, the formation of the dummy gate structures 124 also includes etching the dielectric material and the conductive material through the bi-layered hard mask layers 130 to remove the dielectric material and the conductive material uncovered by the bi-layered hard mask layers 130. After the etching process, the source/drain regions of the semiconductor fin structures 104 are exposed. In some embodiments, the etching process includes one or more dry etching processes, wet etching processes, or a combination thereof.

A dielectric material 136 is globally formed over the semiconductor structure of FIG. 1E, as shown in FIGS. 1F, 1F-1, 1F-2 and 1F-3, in accordance with some embodiments. The dielectric material 136 is conformally formed along the upper surfaces and the sidewalls of the bi-layered hard mask layers 130, the sidewalls of the dummy gate structures 124, the upper surfaces of the semiconductor fin structures 104, and the upper surfaces of the protection layers 118, in accordance with some embodiments. The dielectric material 136 is filled into the gaps 122 to cover the sidewalls of the semiconductor fin structures 104, the sidewalls of the protection layers 118, the sidewalls of the dielectric fin structures 116, and the upper surfaces of the vertical portions 120V of the isolation structure 120, in accordance with some embodiments. In some embodiments, the gaps 122 are substantially entirely filled by the dielectric material 136.

In some embodiments, the dielectric material 136 has a dielectric constant greater than about 7. For example, the dielectric material 136 is $Al_2O_3$, $HfO_2$, $ZrO_2$, HfAlO, HfSiO, or a combination thereof. In some embodiments, the dielectric material 136 is formed using LPCVD, PECVD, HDP-CVD, HARP, FCVD, ALD, another suitable method, or a combination thereof.

The dielectric material 136 is etched to form source/drain spacers 138, as shown in FIGS. 1G, 1G-1, 1G-2 and 1G-3, in accordance with some embodiments. In some embodiments, the etching process is an isotropic etching process such a dry chemical etching or wet etching, or an anisotropic etching process such as dry plasma etching. The etching process removes portions of the dielectric material 136 formed above the semiconductor fin structures 104 and the protection layers 118, in accordance with some embodiments. After the etching process, upper portions of the sidewalls of the dummy gate structures 124, the upper surfaces of the semiconductor fin structures 104, and the upper surfaces of the protection layers 118 are exposed, in accordance with some embodiments.

Remaining portions of the dielectric material 136 leaves in the gaps 122 to form the source/drain spacers 138, in accordance with some embodiments. The source/drain spacers 138 are formed directly above the vertical portions 120V of the isolation structure 120 and between the semiconductor fin structures 104 and the dielectric fin structures 116, in accordance with some embodiments. The source/drain spacers 138 are formed along lower portions of the sidewalls of the dummy gate structures 124, in accordance with some embodiments. The source/drain spacers 138 are used to confine the lateral growth of the subsequently formed source/drain features, thereby forming the source/drain features with a desirable profile.

Gate spacers 140 are formed along sidewalls of the dummy gate structures 124, as shown in FIGS. 1H, 1H-1, 1H-2 and 1H-3, in accordance with some embodiments. The gate spacers 140 are further formed along the sidewalls of the bi-layered hard mask layers 130, in accordance with some embodiments. The gate spacers 140 partially cover the semiconductor fin structures 104, the source/drain spacers 138 and the protection layers 118, in accordance with some embodiments.

In some embodiments, the gate spacers 140 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. In some embodiments, the gate spacers 140 are formed using a deposition process followed by an etching process. In some embodiments, the deposition process includes CVD (such as PECVD, LPCVD or HARP) and/or ALD. In some embodiments, the etching process is an anisotropic etching process such as a dry plasma etching process.

The semiconductor fin structures 104 are recessed to form source/drain recesses 142, as shown in FIGS. 1I, 1I-1, 1I-2 and 1I-3, in accordance with some embodiments. The etching process recesses the semiconductor fin structures 104 uncovered by the gate spacers 140, the dummy gate structures 124, and the bi-layered hard mask layers 130, in accordance with some embodiments. The source/drain recesses 142 are formed between the source/drain spacers 138 and expose the upper surface of the lower portions 104L of the semiconductor fin structures 104, in accordance with some embodiments. In some embodiments, the recessing process includes a dry etching process, a wet etching process, or a combination thereof.

During the etching process of recessing the semiconductor fin structures 104, the etchant also etches dielectric materials of the semiconductor structures, in accordance with some embodiments. During the etching process, the etching rate of the dielectric material with a higher dielectric constant (such as the source/drain spacers 138 and the protection layers 118) is lower than the etching rate of the dielectric material with a lower dielectric constant (such as the dielectric fin structures 116), in accordance with some embodiments. As a result, the source/drain spacers 138 and the protection layers 118 can protect the dielectric fin structures 116 during the etching process.

The etching process partially removes upper portions of the source/drain spacers 138, uncovered by the gate spacers 140, in accordance with some embodiments. After the etching process, the recessed source/drain spacers 138 has protruding portions 138P at their upper surfaces covered by the gate spacers 140, in accordance with some embodiments.

The etching process also removes the protection layers 118, uncovered by the gate spacers 140, the dummy gate structures 124, and the bi-layered hard mask layers 130, in accordance with some embodiments. After the etching process, the upper surfaces of the dielectric fin structures 116 are exposed, in accordance with some embodiments.

Source/drain features 144 are formed in the source/drain recesses 142, as shown in FIGS. 1J, 1J-1, 1J-2 and 1J-3, in accordance with some embodiments. The source/drain features 144 are formed directly above the lower portions 104L of the semiconductor fin structures 104, in accordance with some embodiments. The source/drain features 144 are formed between and protruding from between the source/drain spacers 138, in accordance with some embodiments.

In some embodiments, the source/drain features 144 are made of any suitable material for an n-type semiconductor device and a p-type semiconductor device, such as Ge, Si, GaAs, AlGaAs, SiGe, GaAsP, SiP, SiC, SiCP, or a combination thereof. In some embodiments, the source/drain features 144 are formed using epitaxial growth process, such as MBE, MOCVD, VPE, another suitable epitaxial growth process, or a combination thereof.

In some embodiments, the source/drain features 144 are in-situ doped during the epitaxial growth process. For example, the source/drain features 144 may be the epitaxially grown SiGe doped with boron (B). For example, the source/drain features 144 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the source/drain features 144 are doped in one or more implantation processes after the epitaxial growth process.

Because the source/drain feature 144 is grown from between the source/drain spacers 138, the lateral growth of the source/drain feature 144 is confined by the source/drain spacers 138, in accordance with some embodiments. As a result, the source/drain feature 144 has a body portion 144B between the source/drain spacers 138. The body portion 144B confined by the source/drain spacers 138 has a column profile, in accordance with some embodiments.

The source/drain feature 144 continues to grow beyond above the source/drain spacers 138, in accordance with some embodiments. As a result, the source/drain feature 144 has a head portion 144H protruding from the source/drain spacers 138, in accordance with some embodiments. Without being confined by the source/drain spacers 138, the head portion 144H is laterally grown and have a faceted profile, in accordance with some embodiments.

In some embodiments, the body portion 144B has a width W1 at the bottom surface of the body portion 144B measured in the X direction. In some embodiments, the width W1 ranges from about 8 nm to about 70 nm. In some embodiments, the body portion 144B has a width W2 at the middle height of the body portion 144B measured in the X direction. In some embodiments, the width W2 ranges from about 8 nm to about 70 nm. In some embodiments, the body portion 144B has a width W3 at the top of the body portion 144B (or at the position of the upper surface of the source/drain spacer 138) measured in the X direction. In some embodiments, the width W3 ranges from about 8 nm to about 70 nm.

In some embodiments, the width W1 is equal to or greater than the width W2. In some embodiments, the width W2 is equal to or greater than the width W3. That is, the body portion 144B may have a substantially consistent width or an upwardly tapering width.

In some embodiments, the body portion 144B has a height H1 measured in the Z direction. In some embodiments, the height H1 ranges from about 40 nm to about 80 nm. In some embodiments, the ratio of the height H1 to the width W1 ranges from about 0.5 to about 10.

In some embodiments, the head portion 144H has a maximum width W4 measured in the X direction. In some embodiments, the width W4 ranges from about 14 nm to about 90 nm. In some embodiments, the ratio of the width W4 to the width W1 ranges from about 1.2 to about 1.8.

In some embodiments, the head portion 144H has a height H2 measured in the Z direction. In some embodiments, the height H2 ranges from about 14 nm to about 90 nm. In some embodiments, the ratio of the height H1 to the height H2 ranges from about 0.8 to about 3.

Because the source/drain spacers 138 confine the lateral growth of the source/drain features 144, the source/drain features 144 can have a more slender column profile (i.e. a higher ratio of height H1 to width W1) than if the source/drain spacers are not formed.

Figures 1, 1J, 2, 3:
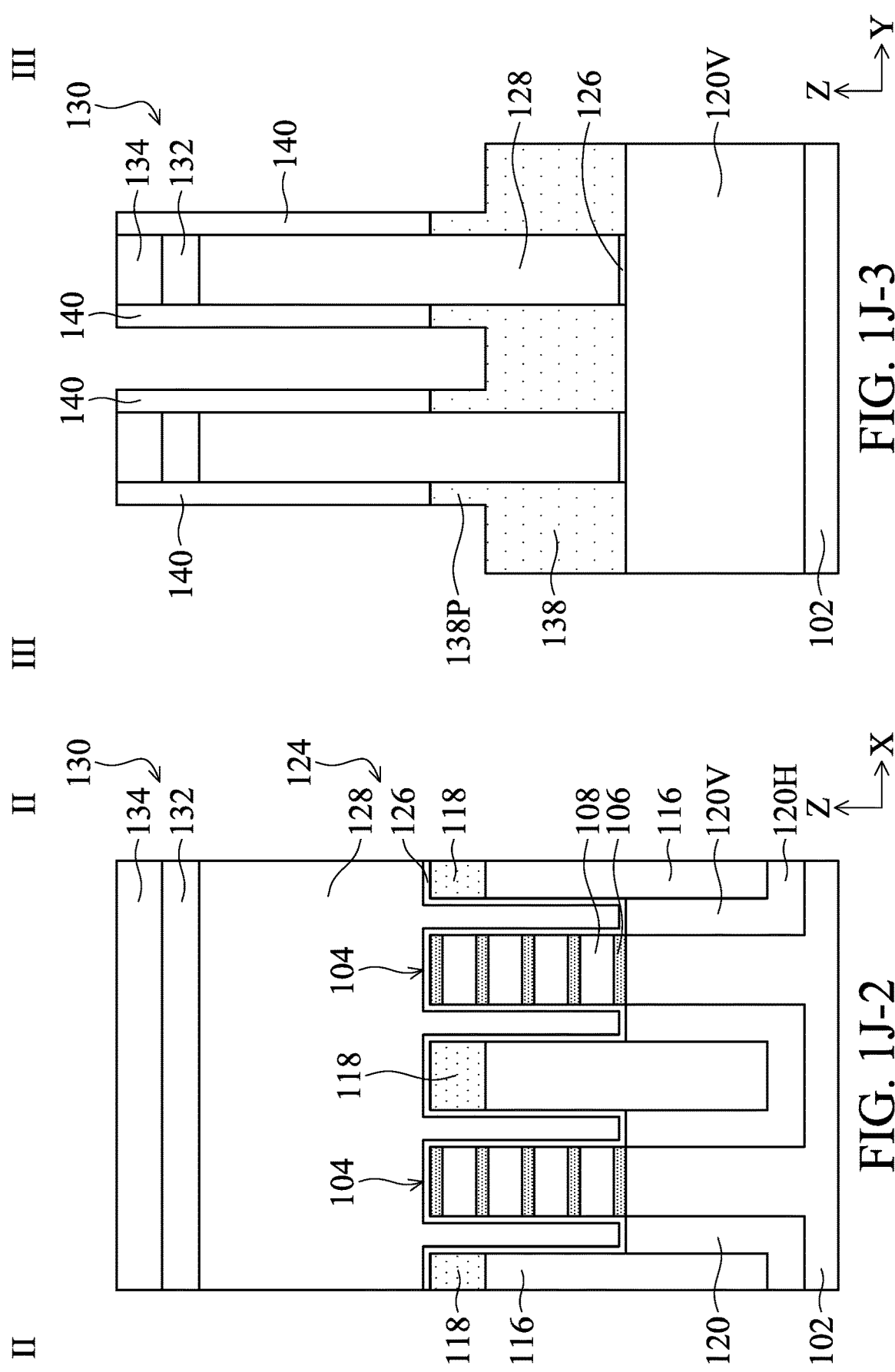
Figures 1, 1L:
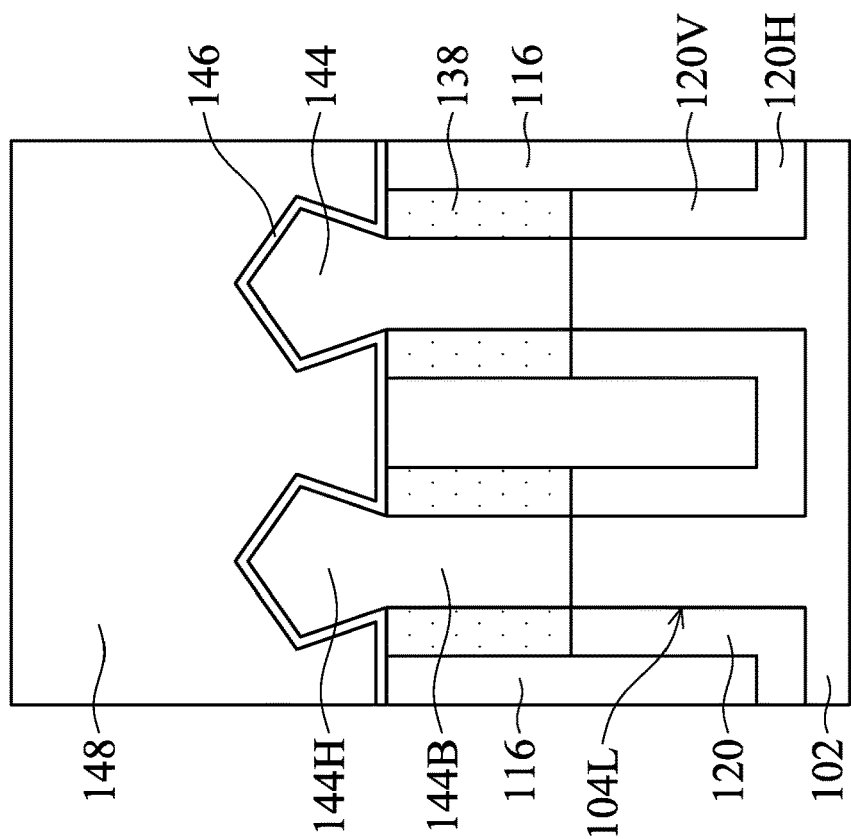
Figure 1L:
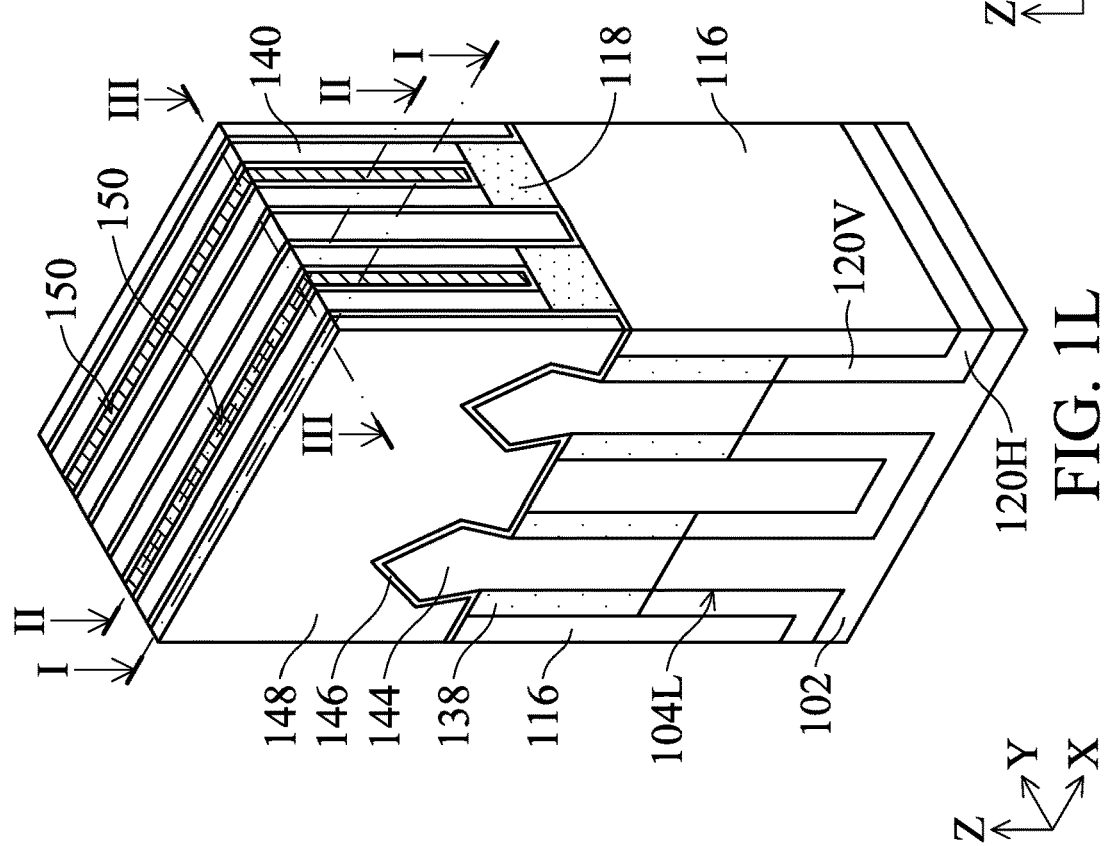
Figures 1, 1M, 2, 3:
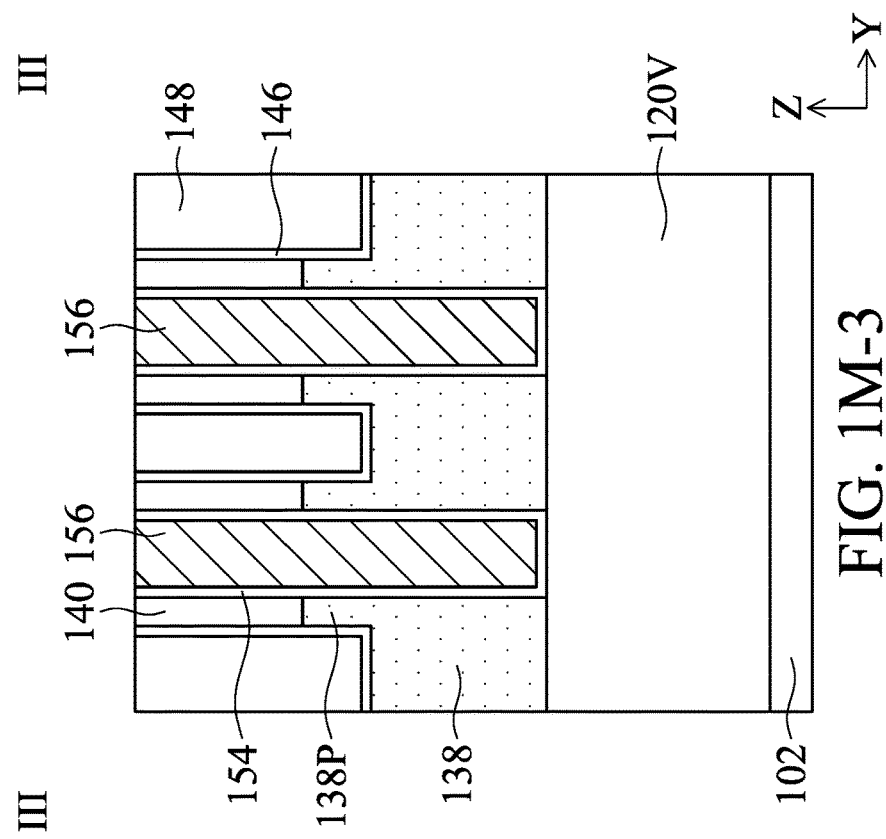
Figures 1, 1M, 2:
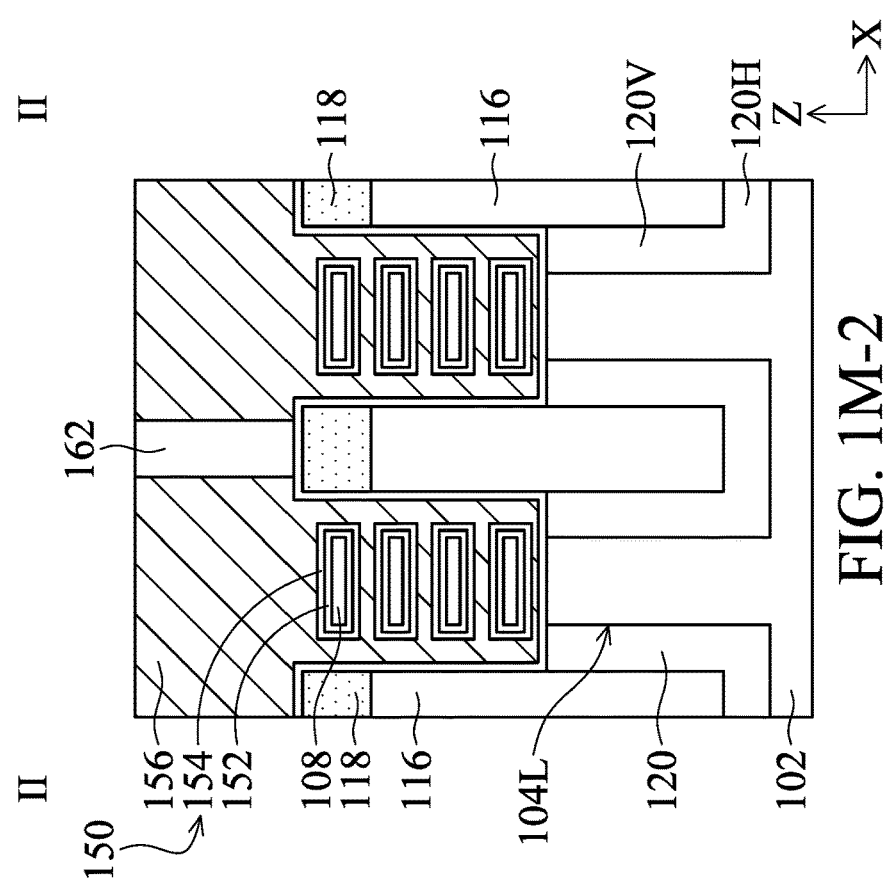

A contact etching stop layer (CESL) 146 is formed over the semiconductor structure of FIG. 1J, as shown in FIGS. 1K, 1K-1, 1K-2 and 1K-3, in accordance with some embodiments. An interlayer dielectric (ILD) layer 148 is formed over the CESL 146, in accordance with some embodiments.

The CESL 146 is conformally formed along the faceted surfaces of the head portions 144H of the source/drain features 144, the upper surfaces of the source/drain spacers 138, the upper surfaces of the dielectric fin structures 116, the sidewalls of the protruding portions of the source/drain spacers 138, the sidewalls of the protection layers 118, and the sidewalls of the gate spacers 140, in accordance with some embodiments.

In some embodiments, the CESL 146 is made of a dielectric material, such as silicon nitride, silicon oxide, silicon oxynitride, another suitable dielectric material, or a combination thereof. In some embodiments, the dielectric material for the CESL 146 is globally deposited over the semiconductor structure of FIG. 1J. The deposition process includes CVD (such as PECVD, HARP, or a combination thereof), ALD, another suitable method, or a combination thereof.

In some embodiments, the ILD layer 148 is made of a dielectric material, such as tetraethylorthosilicate (TEOS) oxide, un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the dielectric material for the ILD layer 148 is formed using CVD (such as HDP-CVD, PECVD, or HARP), ALD, another suitable method, or a combination thereof.

Afterward, a planarization process such as CMP or an etch-back process is performed on the dielectric materials for the CESL 146 and ILD layer 148, in accordance with some embodiments. The dielectric materials formed above the dummy gate structures 124 are removed to expose the upper surfaces of the dummy gate electrode layers 128, in accordance with some embodiments. The planarization process also removes the bi-layered hard mask layers 130, in accordance with some embodiments.

The dummy gate structures 124 are replaced with metal gate stacks 150, as shown in FIGS. 1L, 1L-1, 1L-2 and 1L-3, in accordance with some embodiments. The replacement process includes removing the dummy gate structures 124, removing the first semiconductor layers 106 of the semiconductor fin structure 104, and forming the metal gate stacks 150 to surround the second semiconductor layers 106, in accordance with some embodiments.

In some embodiments, the dummy gate structures 124 (including the dummy gate electrode layers 128 and the dummy gate dielectric layers 126) are removed to form trenches (not shown) between the gate spacers 140. The removal process includes one or more etching processes. For example, when the dummy gate electrode layers 128 are polysilicon, a wet etchant such as a tetramethylammonium hydroxide (TMAH) solution may be used to selectively remove the dummy gate electrode layers 128. For example, the dummy gate dielectric layers 126 may be thereafter removed using a plasma dry etching, a dry chemical etching, and/or a wet etching.

In some embodiments, the first semiconductor layers 106 of the semiconductor fin structure 104 are removed to form gaps (not shown) between the second semiconductor layers 108 and between the lowermost second semiconductor layer 108 and the lower portion 104L. After removing the first semiconductor layers 106, four main surfaces (an upper surface, two side surfaces, and a bottom surface) of each of the second semiconductor layers 108 are exposed, in accordance with some embodiments. The exposed second semiconductor layers 108 form nanowire structures, which function as a channel region of the resulting semiconductor device and are surrounded by the metal gate stacks 150, in accordance with some embodiments.

In some embodiments, the etching process includes a selective wet etching process, such as APM (e.g., ammonia hydroxide-hydrogen peroxide-water mixture) etching process. In some embodiments, the wet etching process uses etchants such as ammonium hydroxide ($NH_4OH$), TMAH, ethylenediamine pyrocatechol (EDP), and/or potassium hydroxide (KOH) solutions.

An interfacial layer 152, a gate dielectric layer 154, and a gate electrode layer 156 are sequentially formed in the trenches and gaps where the dummy gate structures 124 and the first semiconductor layers 106 are removed, in accordance with some embodiments. The interfacial layer 152, the gate dielectric layer 154 and the gate electrode layer 156 together functions as the metal gate stacks 150, in accordance with some embodiments.

The metal gate stacks 150 surround the nanowire structures of the second semiconductor layers 108, in accordance with some embodiments. The metal gate stacks 150 are arranged in the Y direction and extend in the X direction, in accordance with some embodiments. The metal gate stacks 150 extend across the semiconductor fin structures 104 and the dielectric fin structure 116, in accordance with some embodiments.

The interfacial layer 152 is conformally formed along the main surfaces of the second semiconductor layers 108 to surround the second semiconductor layers 108, in accordance with some embodiments. In some embodiments, the interfacial layer 152 is made of a chemically formed silicon oxide.

The gate dielectric layer 154 is conformally formed on the interfacial layer 152 to surround the second semiconductor layers 108, in accordance with some embodiments. The gate dielectric layer 154 is further formed along the upper surfaces and the sidewalls of the protection layers 118, the sidewalls of the dielectric fin structures 116, the upper surfaces of the isolation structure 120, and the upper surfaces of the lower portion 104L of the semiconductor fin structures 104, in accordance with some embodiments. In some embodiments, the gate dielectric layer 154 is further formed along the upper surface of the ILD layer 148.

In some embodiments, the gate dielectric layer 154 is made of one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, another suitable high-k dielectric material, or a combination thereof. In some embodiments, the gate dielectric layer 154 is formed using CVD, ALD, another suitable method, or a combination thereof.

The gate electrode layer 156 is formed on the gate dielectric layer 154, in accordance with some embodiments. Remaining portions of the trenches and gaps, where the dummy gate structures 124 and the first semiconductor layers 106 are removed, are substantially entirely filled by the gate electrode layer 156, in accordance with some embodiments.

In some embodiments, the gate electrode layer 156 is made of one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate electrode layer 156 is formed using CVD, ALD, electroplating, another suitable method, or a combination thereof.

Afterward, a planarization process such as CMP or an etch-back process is performed on the metal gate stacks 150 to remove the metal gate stacks 150 formed above the ILD layer 148, in accordance with some embodiments. After the planarization process, the upper surface of the ILD layer 148 is exposed, in accordance with some embodiments.

An isolation structure 162 is formed through the ILD layer 148 and the metal gate stacks 150, as shown in FIGS. 1M, 1M-1, 1M-2 and 1M-3, in accordance with some embodiments. The isolation structure 162 extends in the Y direction, in accordance with some embodiments. The isolation structure 162 is formed directly above the dielectric fin structure 116 and the protection layers 118, in accordance with some embodiments.

In some embodiments, the isolation structure 162 is made of an insulating material. In some embodiments, the insulating material for the isolation structure 162 includes $SiO_2$, SiON, SiN, SiC, SiOC, SiOCN, or a combination thereof.

In some embodiments, the formation of the isolation structure 162 includes performing a cutting process to form a trench through the ILD layer 148 and the metal gate stacks 150. The cutting process cuts the metal gate stacks 150 into sub-metal gate stacks 151. In some embodiments, the trench exposes the upper surfaces and sidewalls of the protection layers 118 and the upper surface of the dielectric fin structures 116. In some embodiments, the cutting process includes photolithography and etching process.

In some embodiments, an insulating material for the isolation structure 162 is deposited to fill the trench. In some embodiments, the insulating material is further deposited over the ILD layer 148 and the metal gate stacks 150.

In some embodiments, afterward, the insulating material over the ILD layer 148 and the metal gate stacks 150 are removed. In some embodiments, the removal process is CMP or etch-back process.

Contact openings (not shown) are formed through the ILD layer 148 and CESL 146, in accordance with some embodiments. In some embodiments, the contact openings are formed using a photolithography process and an etching process. The contact openings expose the upper surfaces of the source/drain features 144, in accordance with some embodiments. In some embodiments, the etching process further recesses the head portion 144H of the source/drain features 144.

In some embodiments, after the etching process, the head portion 144H has a width W5 at the upper surface of the head portion 144H measured in the X direction. In some embodiments, the width W5 ranges from about 14 nm to about 90 nm. In some embodiments, the ratio of the width W5 to the width W1 ranges from about 1.2 to about 1.8.

In some embodiments, after the etching process, the head portion 144H of source/drain feature 144 has a height H3 measured in the Z direction. In some embodiments, the height H3 ranges from about 7 nm to about 45 nm. In some embodiments, the ratio of the height H1 to the height H3 ranges from about 1.5 to about 6.

Silicides 158 are formed on the upper surfaces of the source/drain features 144, as shown in FIGS. 1M, 1M-1, 1M-2 and 1M-3, in accordance with some embodiments.

In some embodiments, the silicides 158 are made of WSi, NiSi, TiSi, CoSi, and/or another suitable silicide material. In some embodiments, the formation of the silicides 158 includes depositing a metal material over the ILD layer 148 and along the sidewalls and bottom surfaces of the contact openings, annealing the metal material so that the metal material reacts with the source/drain features 144, and etching away the unreacted portion of the metal material. In some embodiments, the deposition process includes CVD, ALD, PVD, and/or another suitable method. In some embodiments, the anneal process includes a rapid temperature anneal (RTA) process. In some embodiments, the etching process includes a wet etching.

Contacts 160 are formed through the ILD layer 148 and land on the silicides 158, as shown in FIGS. 1M, 1M-1, 1M-2 and 1M-3, in accordance with some embodiments.

In some embodiments, the contacts 160 are made of a conductive material, such as Co, Ni, W, Ti, Ta, Cu, Al, TiN, TaN, and/or another suitable conductive material. The formation of the contacts 160 includes depositing a conductive material over the ILD layer 148 and filling the contact openings, and removing the conductive material over the ILD layer 148. In some embodiments, the deposition process includes CVD, ALD, PVD, and/or another suitable method. In some embodiments, the removal process is CMP.

After the contacts 160 are formed, the semiconductor device 100 is obtained.

By forming the source/drain spacer 138 to confine the lateral growth of the source/drain feature 144, the source/drain feature 144 can have a body portion 144B with a slender column profile. The source/drain feature 144 having a narrower width can reduce the parasitic capacitance between the gate stack and the source/drain feature, thereby enhancing the operation speed of the semiconductor device.

In addition, the source/drain spacers 138 are formed of the dielectric material with a high dielectric constant (such as greater than 7) so that the consumption of the source/drain spacers 138 during the etching process of forming the source/drain recesses 142 may be reduced. If consumption of the source/drain spacers 138 is too high, the height H1 of the body portion 144B of the source/drain feature 144 may be decreased. Therefore, the source/drain feature 144 can be formed to have a larger proportion of the body portion 144B and a smaller proportion of the head portion 144H. That is, the ratio of the height H1 to the height H3 is increased. As a result, the parasitic capacitance between the gate stack and the source/drain feature can be reduced further, thereby further enhancing the operation speed of the semiconductor device.

Although the embodiments described above in FIGS. 1A through 1M-3 are used in the GAA device, the concept of the embodiments may be also used in the FinFET device and be described in FIGS. 2A through 2E-3.

Figures 1, 2D:
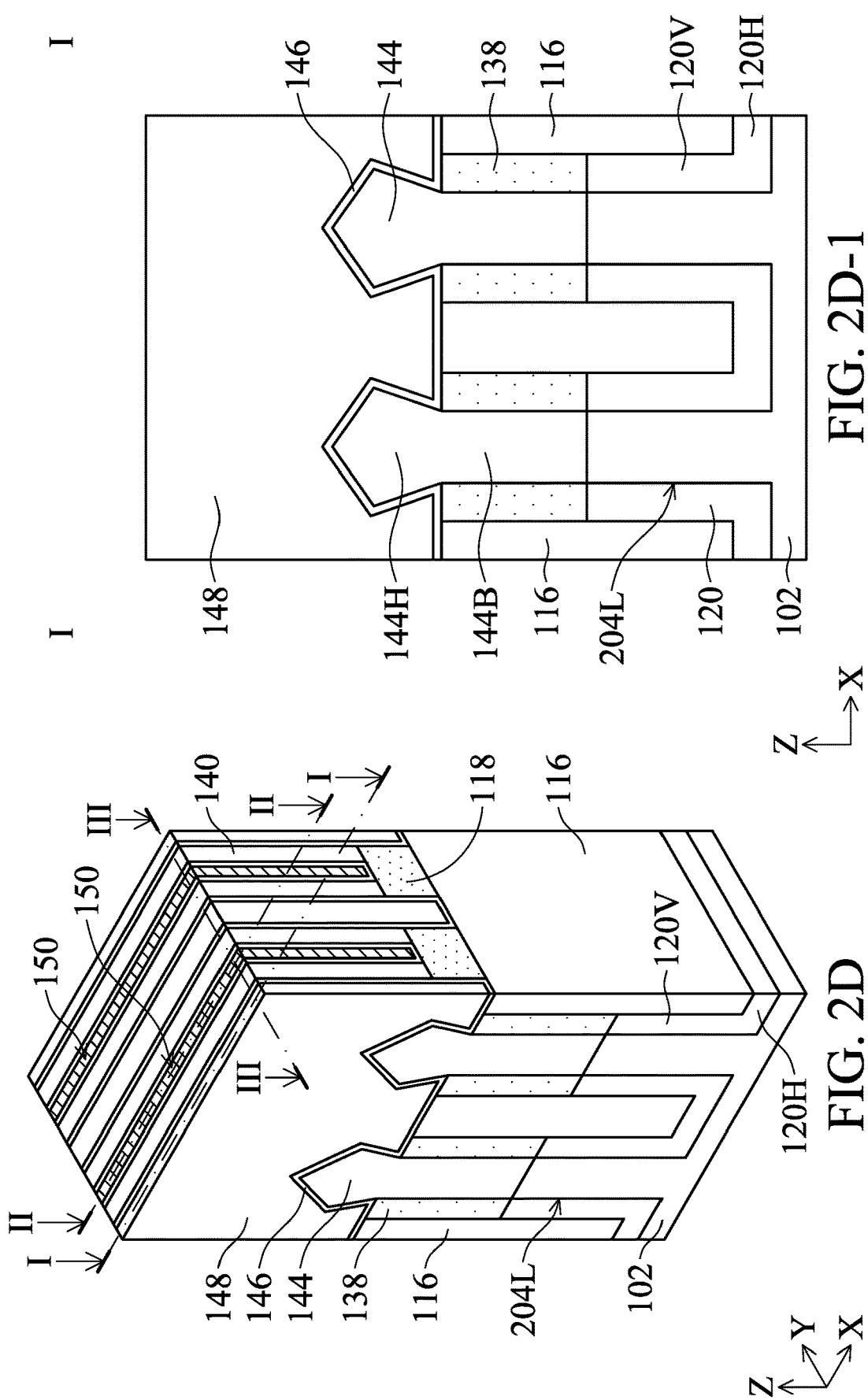
Figures 2, 2E, 3:
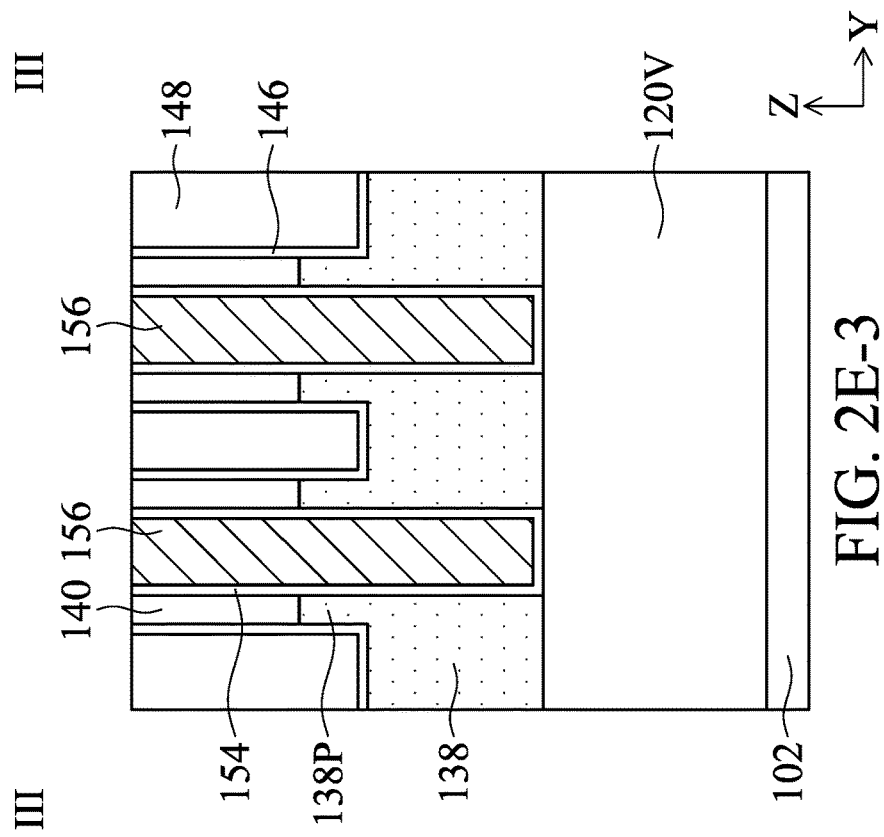
Figures 2, 2E:
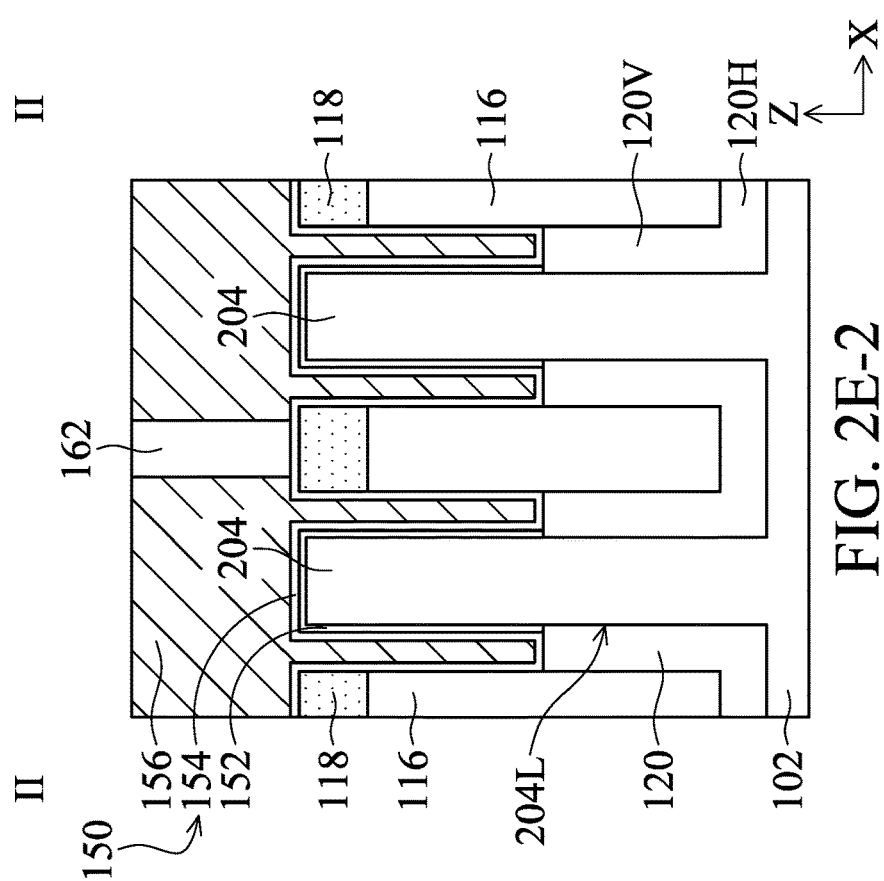

FIGS. 2A-2E are perspective views illustrating the formation of a semiconductor device 200 at various intermediate stages, in accordance with some embodiments of the disclosure. FIGS. 2A-1 through 2E-1 are cross-sectional views of semiconductor structures along line I-I in FIGS. 2A-2E, in accordance with some embodiments of the disclosure. FIGS. 2B-2 through 2E-2 are cross-sectional views of semiconductor structures along line II-II in FIGS. 2A-2E, in accordance with some embodiments of the disclosure. FIGS. 2B-3 through 2E-3 are cross-sectional views of semiconductor structures along line in FIGS. 2A-2E in accordance with some embodiments of the disclosure.

A substrate 102 is provided, as shown in FIGS. 2A and 2A-1, in accordance with some embodiments. Semiconductor fin structures 204 are formed over the substrate 102, in accordance with some embodiments. The semiconductor fin structures 204 are arranged in the X direction and extend in the Y direction, in accordance with some embodiments.

In some embodiments, the semiconductor fin structures 204 are formed by a portion of the substrate 102. For example, a patterning process may performed on the substrate 102 to form the fin structures 204.

An isolation structure 120, dielectric fin structures 116, protection layers 118 are formed over the substrate 102, as shown in FIGS. 2A and 2A-1, in accordance with some embodiments. The methods of forming the isolation structure 120, the dielectric fin structures 116, and the protection layers 118 may be the same as or similar to those described above in FIGS. 1B through 1D-1.

The isolation structure 120 includes vertical portions 120V and horizontal portions 120H, in accordance with some embodiments. The vertical portions 120V of the isolation structure 120 surround the lower portions of the semiconductor fin structures 204 and the lower portions of the dielectric fin structures 116, in accordance with some embodiments. The horizontal portions 120H of the isolation structure 120 extend along the upper surface of the substrate 102 between two neighboring semiconductor fin structures 204, in accordance with some embodiments.

The dielectric fin structures 116 are formed adjacent to the semiconductor fin structures 204 and over the horizontal portions 120H of the isolation structure 120 in accordance with some embodiments. The dielectric fin structures 116 are arranged in the X direction and extend in the Y direction, in accordance with some embodiments. The protection layers 118 are formed directly above the dielectric fin structures 116, in accordance with some embodiments.

Dummy gate structures 124 are formed across the semiconductor fin structures 204 and the dielectric fin structures 116, as shown in FIGS. 2B, 2B-1, 2B-2 and 2B-3, in accordance with some embodiments. The bi-layered hard mask layers 130 are formed over the dummy gate structures 124, in accordance with some embodiments. The dummy gate structures 124 are arranged in the Y direction and extend in the X direction, in accordance with some embodiments. The dummy gate structures 124 are filled into the gaps 122, in accordance with some embodiments.

Source/drain spacers 138 are formed in the gaps 122, as shown in FIGS. 2B, 2B-1, 2B-2 and 2B-3, in accordance with some embodiments.

The source/drain spacers 138 are formed directly above the vertical portions of the isolation structures 120 and between the semiconductor fin structures 204 and the dielectric fin structures 116, in accordance with some embodiments. The source/drain spacers 138 are formed along lower portions of the sidewalls of the dummy gate structures 124, in accordance with some embodiments.

Gate spacers 140 are formed along sidewalls of the dummy gate structures 124, as shown in FIGS. 2C, 2C-1, 2C-2 and 2C-3, in accordance with some embodiments. The gate spacers 140 partially cover the source/drain spacers 138 and the protection layers 118, in accordance with some embodiments.

The semiconductor fin structures 204 are recessed to form source/drain recesses, in accordance with some embodiments. Source/drain features 144 are formed in the source/drain recesses, as shown in FIGS. 2C, 2C-1, 2C-2 and 2C-3, in accordance with some embodiments. The source/drain features 144 are formed directly above the lower portions 204L of the semiconductor fin structures 204, in accordance with some embodiments. The source/drain features 144 are formed between and protruding from between the source/drain spacers 138, in accordance with some embodiments.

The CESL 146 is conformally formed along the faceted surfaces of the head portions 144H of the source/drain features 144, the upper surfaces of the source/drain spacers 138, the upper surfaces of the dielectric fin structures 116, the sidewalls of the protruding portions of the source/drain spacers 138, the sidewalls of the protection layers 118, and the sidewalls of the gate spacers 140, as shown in FIGS. 2D, 2D-1, 2D-2 and 2D-3, in accordance with some embodiments. An ILD layer 148 is formed over the CESL 146, in accordance with some embodiments.

The dummy gate structures 124 are replaced with metal gate stacks 150, as shown in FIGS. 2D, 2D-1, 2D-2, and 2D-3, in accordance with some embodiments.

The replacement process includes removing the dummy gate structures 124 by one or more etching process, and forming the metal gate stacks 150 to cover the upper portions of the semiconductor fin structures 204, in accordance with some embodiments.

The metal gate stacks 150 include an interfacial layer 152, a gate dielectric layer 154, and a gate electrode layer 156, in accordance with some embodiments. The interfacial layer 152 is conformally formed along the upper surfaces and the sidewalls of the semiconductor fin structures 204, in accordance with some embodiments.

The gate dielectric layer 154 is conformally formed on the interfacial layer 152, in accordance with some embodiments. The gate dielectric layer 154 is further formed along the upper surfaces and the sidewalls of the protection layers 118, the sidewalls of the dielectric fin structures 116, and the upper surfaces of the isolation structure 120, in accordance with some embodiments. The gate electrode layer 156 is formed on the gate dielectric layer 154, in accordance with some embodiments.

An isolation structure 162 is formed through the ILD layer 148 and the metal gate stacks 150, as shown in FIGS. 2E, 2E-1, 2E-2 and 2E-3, in accordance with some embodiments. The isolation structure 162 extends in the Y direction, in accordance with some embodiments. The isolation structure 162 is formed directly above the dielectric fin structure 116 and the protection layers 118, in accordance with some embodiments.

After forming the isolation structure 162, the metal gate stacks 150 are cut into sub-metal gate stacks 151, in accordance with some embodiments.

Silicides 158 are formed on the source/drain features 144, as shown in FIGS. 2E, 2E-1, 2E-2 and 2E-3, in accordance with some embodiments. Contacts 160 are formed through the ILD layer 148 and land on the silicides 158 to form a semiconductor device 200, in accordance with some embodiments. The methods of forming the silicides 158 and the contacts 160 may be the same as or similar to those described above in FIGS. 1M though 1M-3.

As described above, the semiconductor device structure includes a substrate 102, a semiconductor fin structure 104, an isolation structure 120, source/drain spacers 138, and a source/drain feature 144, in accordance with some embodiments. The isolation structure 120 includes a vertical portion 120V surrounding the semiconductor fin structure 104, in accordance with some embodiments. The source/drain spacers 138 are formed directly above the vertical portion 120V of the isolation structure 120, in accordance with some embodiments. The source/drain feature 144 is interposed between the source/drain spacers 138, in accordance with some embodiments. Because the source/drain spacers 138 confine the lateral growth of the source/drain feature 144, the source/drain feature 144 can be formed to have a narrower width than if the source/drain spacers are not formed, in accordance with some embodiments. As a result, the source/drain feature 144 having a narrower width can reduce the parasitic capacitance between the gate stack and the source/drain feature, thereby enhancing the operation speed of the semiconductor device, in accordance with some embodiments.

Embodiments of a semiconductor device structure may be provided. The semiconductor device structure may include a semiconductor fin structure, an isolation structure surrounding the semiconductor fin structure, source/drain spacers over the isolation structure, and a source/drain feature interposed between the source/drain spacers. Because the source/drain spacers confine the lateral growth of the source/drain feature, the source/drain feature may have a narrower width. As a result, the parasitic capacitance of the semiconductor device may be reduced, thereby enhancing the operation speed of the semiconductor device.

In some embodiments, a semiconductor device structure is provided. The semiconductor device structure includes a fin structure over a substrate, a first dielectric layer adjacent to the fin structure, and a second dielectric layer covering a sidewall of the first dielectric layer. The first dielectric layer has a different etching selectivity than the second dielectric layer. A bottom portion of the second dielectric layer is lower than a bottom surface of the first dielectric layer. The semiconductor device structure also includes a source/drain feature over the fin structure and covering a sidewall of the second dielectric layer, nanostructures over the fin structure, and a gate stack wrapping around the nanostructures.

In some embodiments, a semiconductor device structure is provided. The semiconductor device structure includes a fin structure over a substrate, a first isolation structure surrounding the fin structure, and a first dielectric layer adjacent to the fin structure. A top portion of the first dielectric layer protrudes over the first isolation structure. The semiconductor device structure also includes a second dielectric layer over the first isolation structure and adjacent to the top portion of the first dielectric layer and the first dielectric layer has a different etching selectivity than the second dielectric layer. The semiconductor device structure also includes a source/drain feature over the fin structure and the second dielectric layer is between the source/drain feature and the top portion of the first dielectric layer. The semiconductor device structure also includes nanostructures over the fin structure and a gate stack wrapping around the nanostructures and over the top portion of the first dielectric layer.

In some embodiments, a method for forming a semiconductor device structure is provided. The method includes forming a fin structure over a substrate, forming an insulating material along the fin structure, and forming a first dielectric layer adjacent to the fin structure. The first dielectric layer is separated from the fin structure by the insulating material. The method also includes recessing the insulating material to form a first gap between the fin structure and the first dielectric layer, filling the first gap with a second dielectric layer, and etching a source/drain region of the fin structure to form a recess. During etching the source/drain region of the fin structure, the second dielectric layer has a different etching selectivity than the first dielectric layer and protects a sidewall of the first dielectric layer. The method also includes forming a source/drain feature from the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a fin structure over a substrate;
   a first dielectric layer adjacent to the fin structure;
   a second dielectric layer covering a sidewall of the first dielectric layer, wherein the first dielectric layer has a different etching selectivity than the second dielectric layer, and wherein a bottom portion of the second dielectric layer is lower than a bottom surface of the first dielectric layer;
   a source/drain feature over the fin structure and covering a sidewall of the first dielectric layer;
   nanostructures over the fin structure; and
   a gate stack wrapping around the nanostructures.

2. The semiconductor device structure as claimed in claim 1, further comprising:
   a third dielectric layer aligned over the second dielectric layer, wherein the third dielectric layer has a different etching selectivity than the first dielectric layer.

3. The semiconductor device structure as claimed in claim 2, wherein the gate stack wraps the third dielectric layer and the second dielectric layer.

4. The semiconductor device structure as claimed in claim 2, further comprising:
   a gate isolation structure over the third dielectric layer, wherein the gate isolation structure separates two portions of the gate stack.

5. The semiconductor device structure as claimed in claim 2, further comprising:
   a gate spacer layer along a sidewall of the gate stack, wherein the gate spacer layer covers the first dielectric layer and the third dielectric layer; and
   an interlayer dielectric layer over the source/drain feature, wherein the interlayer dielectric layer covers the first dielectric layer and the second dielectric layer.

6. The semiconductor device structure as claimed in claim 1, wherein the fin structure and the first dielectric layer extend in a first direction, and the gate stack extends in a second direction that is different than the first direction.

7. The semiconductor device structure as claimed in claim 1, wherein the first dielectric layer has a first upper surface and a second upper surface, and the first upper surface is higher than the second upper surface.

8. The semiconductor device structure as claimed in claim 1, further comprising:
   an isolation structure surrounding the fin structure and surrounding the bottom portion of the second dielectric layer.

9. A semiconductor device structure, comprising:
   a fin structure over a substrate;
   a first isolation structure surrounding the fin structure;
   a first dielectric layer adjacent to the fin structure, wherein a top portion of the first dielectric layer protrudes over the first isolation structure;
   a second dielectric layer over the first isolation structure and adjacent to the top portion of the first dielectric layer, wherein the first dielectric layer has a different etching selectivity than the second dielectric layer;
   a source/drain feature over the fin structure, wherein the second dielectric layer is between the source/drain feature and the top portion of the first dielectric layer;
   nanostructures over the fin structure; and
   a gate stack wrapping around the nanostructures and over the top portion of the first dielectric layer.

10. The semiconductor device structure as claimed in claim 9, wherein the first isolation structure comprises a vertical portion extending between the fin structure and the first dielectric layer.

11. The semiconductor device structure as claimed in claim 10, wherein the second dielectric layer contacts an upper surface of the vertical portion of the first isolation structure.

12. The semiconductor device structure as claimed in claim 10, wherein the first isolation structure comprises a horizontal portion extending below the first dielectric layer.

13. The semiconductor device structure as claimed in claim 9, wherein the source/drain feature includes:
   a body portion contacting the second dielectric layer; and
   a head portion over the body portion and higher than an upper surface of the first dielectric layer and an upper surface of the second dielectric layer.

14. The semiconductor device structure as claimed in claim 13, wherein the head portion of the source/drain feature is wider than the body portion of the source/drain feature and the head portion of the source/drain feature is shorter than the body portion of the source/drain feature.

15. The semiconductor device structure as claimed in claim 13, further comprising:
   a contact etching stop layer extending along a surface of the head portion of the source/drain feature, the upper surface of the second dielectric layer and the upper surface of the first dielectric layer; and
   an interlayer dielectric layer over the contact etching stop layer.

16. The semiconductor device structure as claimed in claim 15, further comprising:
   a second isolation structure through the interlayer dielectric layer and the contact etching stop layer, wherein the second isolation structure is located directly above the first dielectric layer.

17. A method for forming a semiconductor device structure, comprising:

forming a fin structure over a substrate;
forming an insulating material along the fin structure;
forming a first dielectric layer adjacent to the fin structure, wherein the first dielectric layer is separated from the fin structure by the insulating material;
recessing the insulating material to form a first gap between the fin structure and the first dielectric layer;
filling the first gap with a second dielectric layer;
etching a source/drain region of the fin structure to form a recess, wherein during etching the source/drain region of the fin structure, the second dielectric layer has a different etching selectivity than the first dielectric layer and protects a sidewall of the first dielectric layer;
forming a source/drain feature from the recess; and
forming an isolation structure directly on the first dielectric layer after forming the source/drain feature.

18. The method for forming the semiconductor device structure as claimed in claim 17, further comprising:
forming a third dielectric layer over the first dielectric layer, wherein during etching the source/drain region of the fin structure, the third dielectric layer has a different etching selectivity than the first dielectric layer; and
forming a gate structure over the fin structure, the first dielectric layer and third dielectric layer.

19. The method for forming the semiconductor device structure as claimed in claim 18, wherein etching the source/drain region of the fin structure comprises removing a portion of the third dielectric layer uncovered by the gate structure and removing a portion of the second dielectric layer.

20. The method for forming the semiconductor device structure as claimed in claim 18, wherein the fin structure includes first semiconductor layers interposed by second semiconductor layers, and the method further comprises:
removing the gate structure;
removing the first semiconductor layers of the fin structure to form nanostructures from the second semiconductor layers; and
forming a gate stack around the nanostructures.

* * * * *